(12) United States Patent
Goel et al.

(10) Patent No.: US 11,601,139 B2
(45) Date of Patent: Mar. 7, 2023

(54) METHODS AND APPARATUS TO DETERMINE AND APPLY POLARITY-BASED ERROR CORRECTION CODE

(71) Applicant: TEXAS INSTRUMENTS INCORPORATED, Dallas, TX (US)

(72) Inventors: Manish Goel, Plano, TX (US); Yuming Zhu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 430 days.

(21) Appl. No.: 16/680,738

(22) Filed: Nov. 12, 2019

(65) Prior Publication Data

US 2020/0083907 A1 Mar. 12, 2020

Related U.S. Application Data

(63) Continuation of application No. 15/480,062, filed on Apr. 5, 2017, now Pat. No. 10,523,240.

(60) Provisional application No. 62/344,807, filed on Jun. 2, 2016.

(51) Int. Cl.
  *H03M 13/13* (2006.01)
  *G06F 11/10* (2006.01)
  *G11C 29/52* (2006.01)

(52) U.S. Cl.
  CPC ......... *H03M 13/13* (2013.01); *G06F 11/1068* (2013.01); *G11C 29/52* (2013.01)

(58) Field of Classification Search
  CPC ..... H03M 13/13; G06F 11/1068; G11C 29/52
  See application file for complete search history.

(56) References Cited

U.S. PATENT DOCUMENTS

| 8,694,872 | B2 | 4/2014 | Goel | |
| 9,501,352 | B2* | 11/2016 | Hoya | .................. G06F 11/1012 |
| 2009/0172496 | A1* | 7/2009 | Roine | ................. H03M 13/451 |
| | | | | 714/758 |

OTHER PUBLICATIONS

Thanigai et al., "MSP430 Fram Quality and Reliability," Texas Instruments, Application Report, Mar. 2012, Revised May 2014, 9 pages.

* cited by examiner

*Primary Examiner* — Cynthia Britt
*Assistant Examiner* — Rong Tang
(74) *Attorney, Agent, or Firm* — Frank D. Cimino

(57) ABSTRACT

Methods, apparatus, systems and articles of manufacture to determine and apply polarity-based error correction code are disclosed. In some examples, the methods and apparatus create an array by setting a first set of bit locations of a code word to have a first value and setting a second set of bit locations of the code word to have a second value different from the first value. In some examples, when the array satisfies a parity check, the methods and apparatus determine that bit locations having the first value from the array form a polarity-based error correction code.

19 Claims, 6 Drawing Sheets

METHODS AND APPARATUS TO DETERMINE AND APPLY POLARITY-BASED ERROR CORRECTION CODE

RELATED APPLICATION

This application is a continuation of U.S. patent application Ser. No. 15/480,062, filed Apr. 5, 2017, which claims the benefit of U.S. Provisional Patent Application No. 62/344,807, filed on Jun. 2, 2016, each of which is hereby incorporated herein in its entirety.

FIELD OF THE DISCLOSURE

This disclosure relates generally to error correction coding, and, more particularly, to methods and apparatus to determine and apply polarity-based error correction code.

BACKGROUND

In recent years, error correction coding has been applied to non-volatile memory. Some types of non-volatile memory have destructive read operations, which require a value that is read to be written back into memory. Error correction coding allows for the correction of errors in such non-volatile memory when data destructed by a read is not correctly written back into memory. A error correction code word is effectively recreated when errors occur during reading and/or writing and the recreated code word is written back into memory. However, continuous write backs of a same value (e.g., an error correction code word) often cause an imprint effect. Additionally, error correction coding has been applied to communications via a network or bus to recreate transmissions with communication errors. Bus power can be reduced, in some examples, when the next message to be sent across the bus only slightly differs from the previously sent message.

SUMMARY

Methods, apparatus, systems and articles of manufacture to determine and apply polarity-based error correction code are disclosed. In some examples, the methods and apparatus create an array by setting a first set of bit locations of a code word to have a first value, and setting all other bit locations of the code word to have a second value different from the first value. In some examples, when the array satisfies a parity check, determining that bit locations having the first value from the array form polarity-based error correction code.

DETAILED DESCRIPTION

Figure 1:
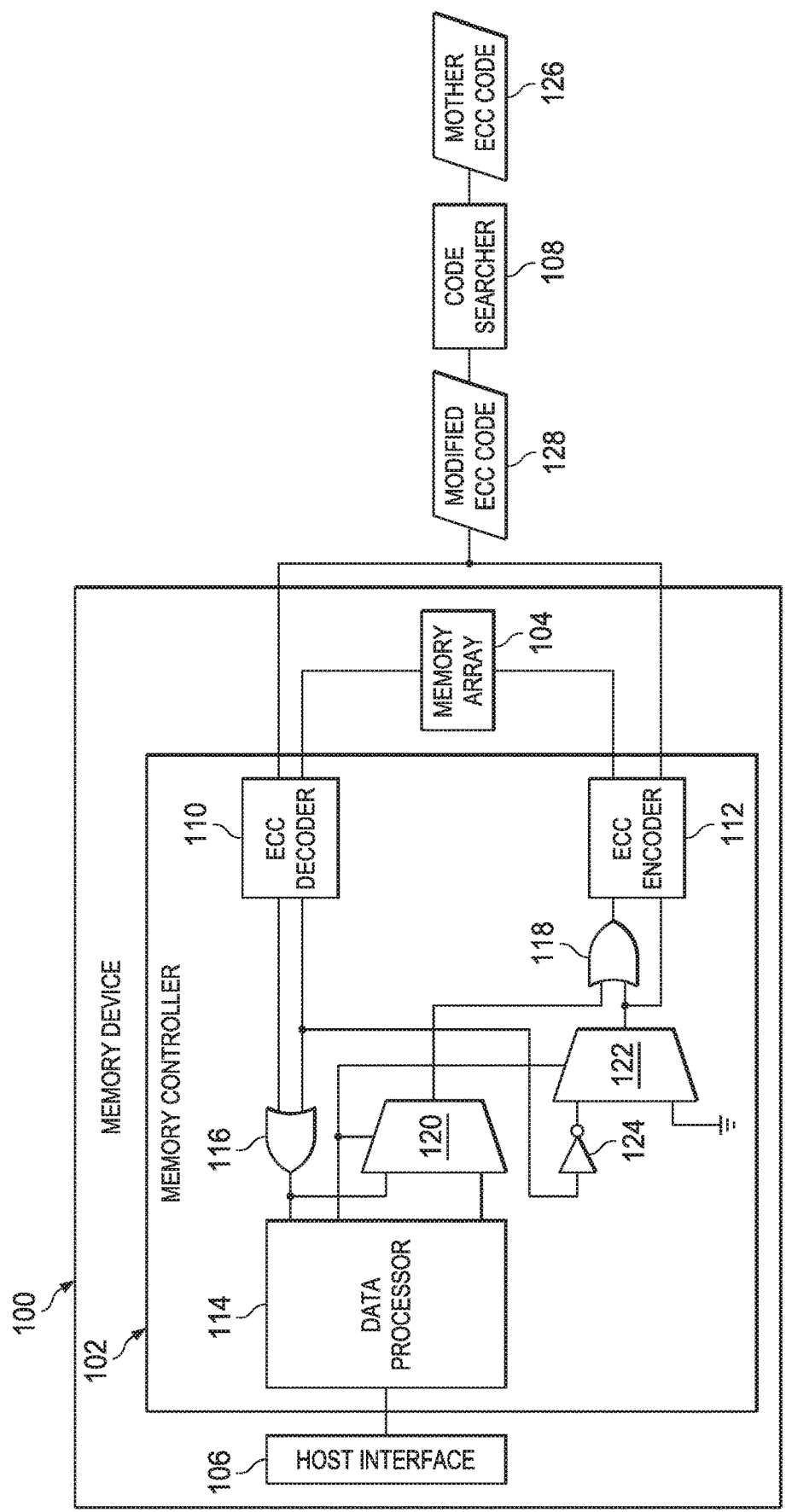
FIG. 1 is a block diagram illustrating an example device including an example controller in communication with an example memory array.

In the field of memory, destructive read non-volatile memory ("DRNVM") requires values to be written-back into memory when the values are read. Ferroelectric random access memory ("FeRAM") is a particular type of DRNVM. FeRAM provides numerous benefits including low power usage, fast read/write access, and high maximum number of read/write cycles (e.g., exceeding $10^{16}$ read/write cycle for 3.3 V devices). When FeRAM, and other DRNVM, is read, the content(s) of memory are retrieved and removed (e.g., destroyed) from memory. To maintain the content(s) of the memory in FeRAM (e.g., for a subsequent read), a write-back operation is carried out after each read operation to replicate the contents of the memory cells that were read. Over time, FeRAM is subject to preferential polarization (e.g., electric polarization, such as, for example, a lack of charge representing a '0' or the presence of charge representing a '1') from previous writes. In other words, continuous write-backs and/or long time storage of the same value has an "imprint" effect on FeRAM. This "imprint" effect makes it difficult to write different values (e.g., write failure) and/or difficult to read back values (e.g., read failure). In some examples, the "imprint" effect can be reduced and/or eliminated by writing-back the inverse of the data (e.g., information) that was read. To identify whether stored data is flipped (e.g., an inverted), a polarity indicator may be used.

In the field of bus computing, power is required to send data between components. The activity of a bus is directly proportional to the hamming distance between consecutive values on the bus. In some examples, the hamming distance between two messages is the number of positions at which corresponding symbols (e.g., bits) are different. For example, the hamming distance between "001" and "011" is one. While examples disclosed herein express symbols in terms of bits, symbols may be any size (e.g., bytes, megabytes, etc.). The larger the hamming distance, the greater activity across the bus. For example, when the symbols of a first message do not differ significantly from the symbols of a second message, such as when the second message matches all but one bit of the first message, the activity of the bus corresponds only to changing the non-matching bit. However, when the symbols of a first message differ significantly from the symbols of a second message, such as when a second message is the inverse of the first message, the activity of the bus corresponds to changing every bit. The greater the activity across the bus, the more power is consumed. Accordingly, the hamming distance is directly proportional to power consumption. In some examples, bus power can be reduced if the first message is more similar to the inverse of the second message than the second message (e.g., the first message is 11111, the second message is 00001, and the inverse of the second message is 11110). Again, to identify whether a message is flipped (e.g., inverted), a polarity indicator may be sent with a message.

Data, whether stored in memory or communicated, is prone to errors. Therefore, data is often encoded with error correction coding ("ECC"). ECC applies one or more equations, functions, or applications to data symbols to calculate parity symbols. The data and parity symbols are used together as a code word that, if a certain number of errors occur therein, can be recreated using the non-erred data and/or parity symbols. ECC schemes have a limited number of valid code words. For example, while an ECC scheme having a code word length of L symbols has $2^L$ unique combinations, not all of these combinations are valid code words. As described above, because a code word includes data symbols and parity symbols that are calculated from the data symbols (via one or more equations, functions, applications, etc.), only a subset of the $2^L$ combinations meet such requirements.

In some examples, ECC is paired with data inversion. However, if the entire code word (e.g., data encoded with ECC) is inverted, the parity calculated from the inverse of data must be equal to the inverse of the parity calculated from data (e.g., $par(\overline{d})=\overline{par(d)}$). In other words, for ECC to correct errors in an inverted code word, the parity symbols of the inverted code word (e.g., $par(\overline{d})$) must be the same as the parity symbols calculated from the inverse of the data symbols using the one or more equations, functions, or applications of the ECC scheme (e.g., $par(\overline{d})$).

However, it is not necessarily true that the parity calculated from the inverse of data is equal to the inverse of the parity calculated from data $$\left(\text{e.g., } par(\overline{d}) \stackrel{?}{=} \overline{par(d)}\right).$$

Different ECC utilize different mechanisms to determine the parity from data, include differing lengths of code words, and have differing numbers of valid code words. Some examples of ECC include, without limitation, Reed-Solomon coding, Golay, Bose Chaudhuri Hocquenghem ("BCH"), Multidimensional parity, and Hamming codes. Even further, ECC schemes come in varying forms, such as single error correction and double error detection ("SEC-DED"), double error correction and triple error detection ("DEC-TED"), etc. Still further, these schemes are often uniformly shortened by removing leading or trailing symbols to decrease code word sizes (e.g., uniform shortened SEC-DED, uniform shortened DEC-TED, etc.). Not all ECC and/or not all code words satisfy the property that $par(\overline{d})$ equals $\overline{par(d)}$.

In some examples, only data symbols are inverted during ECC encoding and decoding to maintain error correction capabilities. In such examples, because the party symbols remain unchanged, the "imprint" effect remains in FeRAM and bus power reduction cannot be maximized. In some examples, data symbols are flipped (e.g., inverted) and a polarity indicator (e.g., an indication of whether a bit has been flipped) is stored separate from the data. However, separating a polarity indicator from ECC encoded data makes the polarity indicator susceptible to errors.

Disclosed examples determine polarity-based error correction code ("PBECC") in which $par(\overline{d})$ equals $\overline{par(d)}$, such that an entire code word is invertible while maintaining error correction capabilities. Further, disclosed examples include one or more polarity indicator(s) within the ECC encoded data such that the data, parity, and polarity indicator(s) are all correctable within t errors.

FIG. 1 is a block diagram illustrating an example device 100 including an example controller 102 in communication with an example memory array 104. The example device 100 is useful in mobile applications requiring lower power consumption. However, the example device 100 may be used in any application where small low-power memory with fast read/write capabilities are required. The example device 100 includes a host interface 106 connected to the memory controller 102 for application and/or user commands, input data, read/write instructions, etc. In some examples, the controller 102 is in communication with an example code searcher 108. In some examples, the controller 102 includes an example ECC decoder 110, an example ECC encoder 112, a data processor 114, a first exclusive-or ("XOR") gate 116, a second XOR gate 118, a first multiplexer ("MUX") 120, a second MUX 122, and an inverter 124.

The example memory array 104 is an array of memory cells. In the illustrated example, the example memory 104 is an FeRAM array with a destructive read operation (e.g., DRNVM). While the illustrated example is described with reference to FeRAM, other types of destructive read memory may be utilized without departing from the scope of the present disclosure. In some examples, the memory array 104 includes one or more tangible computer readable storage mediums such as a CD-ROM, a floppy disk, a hard drive, a digital versatile disk (DVD), a Blu-ray disk, or other memory storage device or storage disk. Alternatively, the example memory array 104 may be replaced with a bus (not shown), as the disclosed examples are equally applicable to bus invert coding.

The example code searcher 108, as further described with reference to FIG. 2, accesses an example mother ECC code 126, searches for N locations within the example mother ECC code 126, and outputs a non-uniform modified ECC code 128 of length N that satisfies the property: $par(\overline{d})=\overline{par(d)}$. As used herein, non-uniform modified is defined to mean not consistently modified, such as, for example, adding/removing leading and/or trailing symbols from a code word. In some examples, modified means shortened. In some examples, the example code searcher 108 identifies non-uniform modified ECC code 128 with N bits having K data bits and P parity bits from the example mother ECC code 126 with N0 bits having K0 data bits and P0 parity bits. For example, the mother ECC code 126 may be 127 bits whereas the non-uniform modified ECC code 128 may be 80 bits. The example code searcher 108 sends the non-uniform modified ECC code 128 to the example ECC decoder 110 and the example ECC encoder 112. In some examples, the code searcher 108 is located off-chip from the ECC decoder 110 and the ECC encoder 112. In some examples, the code searcher 108 is located on-chip with the ECC decoder 110 and the ECC encoder 112. While examples disclosed herein express code and/or code words in terms of bits, code and/or code words may include symbols of any size (e.g., bits, bytes, megabytes, etc.).

The example ECC decoder 110 uses the non-uniform modified ECC code 128 to decode polarity-based error correction code words stored in the memory array 104. The example ECC decoder 110 utilizes one or more algorithms for decoding code words. For example, one algorithm for decoding includes calculating syndromes, determining the number of errors and an error locator polynomial from the syndromes, calculating roots of the error location polynomial to find error locations, calculate the error values at those error locations, and correct the errors. Alternate decoding algorithms may be used. As used herein, a syndrome is an effect of an error characterized as a single-frequency wave in the frequency domain. The syndromes of a malformed code word (e.g., a code word with errors) can be calculated by evaluating the malformed code word with the primitive root of the finite field of the code word (e.g., $GF(2^m)$). Numerous decoder architectures may be used to implement the one or more algorithms used to decode the code words.

The example ECC encoder 112 uses the non-uniform modified ECC code 128 to encode polarity-based error correction code words and store the code words in the memory array 104. The example ECC encoder 112 utilizes one or more algorithms for encoding code words. For example, parity symbols may be calculated from data and polarity indicators using one or more equations and expressed as coefficients of a polynomial. Alternate encoding algorithms may be used.

The example data processor 114 processes data-in (e.g., new data to be stored in the example memory array 104) and data-out (e.g., data read from the example memory array 104). In some examples, the data processor 114 receives instructions, data, and/or commands from the host interface 106. In some examples, the data processor 114 sets a write-back ("WB") indicator to identify when data read from the memory array 104 is to be written-back into the memory-array 104, such as when the memory array 104 is DRNVM. In such examples, the data processor 114 sends the WB indicator to the example first MUX 120 and the example second MUX 122. Thus, the example data processor 114 controls the example controller 102.

The example first XOR gate 116 and the example second XOR gate 118 have data (e.g., A) and polarity indicators (e.g., B) as inputs and output the XOR (e.g., A⊕B) of the inputs (e.g., A, B). For example, the first XOR gate 116 receives decoded data and one or more polarity indicators (e.g., the number of polarity indicators match the size of the decoded data) from the ECC decoder 110. As used herein, XOR is defined by Table 1:

TABLE 1

| A | B | A ⊕ B |
|---|---|-------|
| 0 | 0 | 0 |
| 0 | 1 | 1 |
| 1 | 0 | 1 |
| 1 | 1 | 0 |

By XORing the decoded data with the polarity indicators, the example first XOR gate 116 outputs the inverse of the decoded data when the polarity indicators are '1' (e.g., indicating that the decoded data was previously inverted) and outputs the decoded data when the polarity indicators are '0' (e.g., indicating that the decoded data is not inverted).

In some examples, the second XOR gate 118 receives data-in (e.g., new data) and polarity indicators having a value of '0.' In some examples, the second XOR gate 118 receives data-out (e.g., data read from the memory array 104) and the inverse of the previous polarity indicator(s). In such examples, the inputs for the second XOR gate 118 are determined by the example first MUX 120 and the example second MUX 122 and controlled by the WB indicator. As discussed above in reference to the first XOR gate 116, the example second XOR gate 118 outputs the inverse of the data input when the polarity indicators are '1' and outputs the data input when the polarity indicators are '0.'

The example first MUX 120 and the example second MUX 122 are multiplexers with the WB indicator as a selector. The example first MUX 120 selects between data-in (e.g., new data from the data processor 114) and data-out (e.g., data read from the memory array 104). For example, when the WB indicator is a '1' (e.g., logical high), the first MUX 120 selects data-out and when the WB indicator is a '0' (e.g., logical low), the first MUX 120 selects data-in. The example second MUX 122 selects between the inverse of the previous polarity indicator(s) and ground (e.g., logical low). For example, when the WB indicator is a '1' (e.g., logical high), the second MUX 122 selects the inverse of the previous polarity indicator(s) and when the WB indicator is a '0' (e.g., logical low), the second MUX 122 selects ground.

The example inverter 124 inverts the polarity indicator(s) output from the example ECC decoder 110 to the example second MUX 122. In some examples, the inverter 124 is a logical 'NOT' gate.

In operation, the example data processor 114 controls the example controller 102 based on inputs, instructions, commands, etc. from the example host interface 106. The example data processor sets a WB indicator to '0' or '1' depending on whether new data is to be written into the example memory array 104 or if read data is to be written-back into the example memory array 104.

When the WB indicator is a '0' a write-back is not to be performed. In other words, new data is to be stored in the example memory array 104. As disclosed herein, when the WB indicator is a '0,' the example second MUX 122 selects ground (e.g., '0'), the example first MUX 120 selects the new data (e.g., data-in), and both are input into the example second XOR gate 118. Because the polarity indicator(s) are initially selected as ground (e.g., '0'), XORing the data-in and the polarity indicator(s) does not invert the data-in. For example, assume data-in is '0110' and the polarity indicator(s) are '0000.' According to Table 1, the output of the example second XOR gate 118 would be '0110.' As disclosed herein, the example ECC encoder 112 encodes '0110' and one or more polarity indicator(s) '0' with the non-uniform modified ECC code 128 and stores the code word into the example memory array 104.

Thereafter, the example ECC decoder 110 reads the code word from the example memory array 104 and decodes the code word into '0110' and the polarity indicator(s) '0' based on the non-uniform modified ECC code 128. As disclosed herein, if any errors occur to the code word stored in the example memory array 104, the example ECC decoder 110 corrects up to t errors during decoding. '0110' and the polarity indicator(s) '0000' are input into the example first XOR gate 116. XORing '0110' and the polarity indicator(s) '0000' does not invert '0110' and thus the original data-in is read from the example memory array 104 and output to the example data processor 114.

When the WB indicator is a '1,' a write-back is to be performed. In such examples, data read from the memory array 104 is to be written back into the memory array 104 (e.g., in response to a destructive read operation). As described above, continuously writing previously read data back into FeRAM causes an 'imprint' effect. Examples disclosed herein advantageously invert the data when performing a write-back to reduce and/or prevent the 'imprint' effect. As disclosed herein, when the WB indicator is a '1,' the second MUX 122 selects the inversion of the previous polarity indicator(s) (e.g., previous polarity indicator(s)= '0000' inverted previous polarity indicator='1111'), the first MUX 120 selects the read data (e.g., data-out='0110'), and both (e.g., '0110' and '1111') are input into the second XOR gate 118. According to Table 1, the output of the second XOR gate 118 would be '1001.' As disclosed herein, the example ECC encoder 112 encodes '1001' and one or more polarity indicator(s) '1' with polarity-based error correction code and stores the code word into the example memory array 104.

Thereafter, the example ECC decoder 110 reads the code word from the example memory array 104 and decodes the code word into '1001' and the polarity indicator(s) '1' based on the non-uniform modified ECC code 128. As disclosed herein, if any errors occur to the code word stored in the example memory array 104, the example ECC decoder 110 corrects up to t errors during decoding. '1001' and the polarity indicator(s) '1111' are input into the example first XOR gate 116. XORing '1001' and the polarity indicator(s) '1111' inverts '1001' (e.g., '0110') and thus the data written into memory (even though it was inverted) is read from the example memory array 104 and output to the example data processor 114. This cycle may continue as write-backs and/or new writes are needed.

Figure 2:
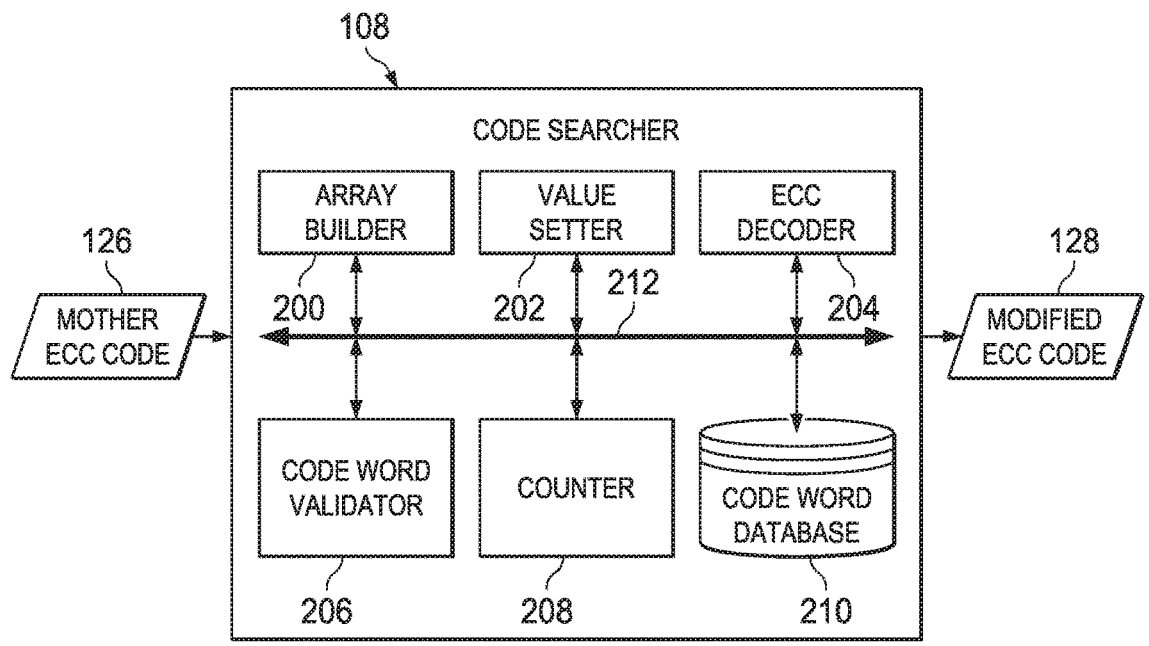
FIG. 2 is a block diagram illustrating a code searcher of the example controller of FIG. 1.

FIG. 2 is a block diagram illustrating an implementation of the example code searcher 108 of the example controller of FIG. 1. As described with reference to FIG. 1, the example ECC encoder 112 and the example ECC decoder 110 use non-uniform modified ECC code 128 to encode and decode data. The example code searcher 108 receives mother ECC code 126 as an input and outputs the non-uniform modified ECC code 128. The example code searcher 108 includes an example array builder 200, an example value setter 202, an example ECC decoder 204, an example code word validator 206, an example counter 208, and an example code word database 210. The example array builder 200, example value setter 202, example ECC decoder 204, example code word validator 206, example counter 208, and example code word database 210 are all connected via a bus 212. In operation, the example code searcher 108 accesses the example mother ECC code 126, searches for N locations within the example mother ECC code 126, and outputs non-uniform modified ECC code 128 of length N that satisfies the property: $\text{par}(\overline{d})=\overline{\text{par}(d)}$.

The example array builder 200 determines a target length for non-uniform modified ECC code 128. In some examples, the array builder 200 identifies locations within the mother ECC code 126 for the example value setter 202 to adjust (e.g. set), such that one or more arrays having N locations with a value of '1' are built. In some examples, the array builder 200 is implemented with a multi-bit multiplexer connected to the example value setter 202. In some examples, the example array builder 200 is implemented with a multiplexer, a bit selector, any other known logic circuit, or any combination thereof. In some examples, the array builder 200 divides an all '1' code word (e.g., $I_N$) into S segments. The example array builder 200 may divide the code word $I_N$ in numerous ways (e.g., each segment does not have to be equal is size). In some examples, the array builder 200 creates a segment of K–t bits. In some examples, the array builder 200 creates one segment with K–X bits and one segment with X–t bits. In some examples, the array builder 200 creates one segment with K–X bits, one segment with X–W bits, and one segment with W–t bits, etc. The example array builder 200 arranges the segments into the mother ECC code 126 to create one or more arrays in one or more arrangements. While examples disclosed herein express code and/or code words in terms of bits, code and/or code words may include symbols of any size (e.g., bits, bytes, megabytes, etc.).

The example value setter 202 sets values to locations in the example mother ECC code 126 identified by the example array builder. In some examples, the value setter 202 is implemented with a multiplexer connected to logical high voltage (e.g., supply voltage) and logical low (e.g., ground). For example, the example value setter 202 may set a location within the example mother ECC code 126 to logical high (e.g., '1') or logical low (e.g., '0'). In some examples, the value setter 202 sets the segments identified by the example array builder to '1' and all other values of the example mother ECC code 126 to '0.' In some examples, the value setter 202 sets the segments identified by the example array builder to '1,' the parity bits P to ',1' and all other values of the example mother ECC code 126 to '0.'

The example ECC decoder 204 uses the mother ECC code 126 to decode arrays formed by the example array builder 200. The example ECC decoder 204 utilizes one or more algorithms for decoding the arrays (e.g., potential code words) and/or correcting t errors. For example, one algorithm for decoding includes calculating syndromes, determining the number of errors and an error locator polynomial from the syndromes, calculating roots of the error location polynomial to find error locations, calculate the error values at those error locations, and correct the errors. Alternate decoding algorithms may be used. The syndromes of a malformed code word (e.g., a code word with errors) can be calculated by evaluating the malformed code word with the primitive root of the finite field of the code word (e.g., $GF(2^m)$). Numerous decoder architectures may be used to implement the one or more algorithms used to decode the code words. In some examples, the ECC decoder 204 corrects t errors in arrays built by the example array builder 200.

The example code word validator 206 determines whether an array having N '1's and N0–N '0's is a valid code word. In some examples, the locations that have '1' values are identified by the example array builder 200 and set by the example value setter 202. In some examples, the code word validator 206 performs a parity check on the array to determine its validity. In some examples, different parity check equations are used for different ECC schemes. If the array having N '1's and N0–N '0's is a valid code word (e.g., the array satisfies the parity check), then the example code word validator 206 determines that the locations where the N '1's are located form a valid all '1' code word in polarity-based error correction code. As discussed above, not all combinations of $2^{N0}$ are valid code words. Thus, finding locations where N '1's occur within the mother ECC code 126 is not trivial.

In some examples, an all '1' code word being a valid code word is indicative that $\text{par}(\overline{d})=\overline{\text{par}(d)}$. For example, let $I_N$ be an all '1' code word of length N. Because a code word includes K data bits d and P parity bits p, it follows that $N=K+P \therefore I_N=I_K+I_P$. Also, because the parity bits are calculated from the data bits, it follows that $I_N=I_K+\text{par}(I_K)$. Thus, $I_P=\text{par}(I_K)$. Further, $I_K$ may be expressed as $I_K=d+\overline{d}$ and $I_P$ may be expressed as $I_P=p+\overline{p}$, where $p=\text{par}(d)$ (e.g., $I_P=\text{par}(d)+\overline{\text{par}(d)}$). For example, if d="0110" and $\overline{d}$="1001," then $d+\overline{d}$="1111"$=I_K$. Similarly, if p="01" and $\overline{p}$="10," then $p+\overline{p}$="11"$=I_P$. Accordingly, $I_P=\text{par}(d+\overline{d})=\text{par}(d)+\text{par}(\overline{d})$. Because $\text{par}(d)+\text{par}(\overline{d})=I_P=\text{par}(d)+\overline{\text{par}(d)}$, it follows that $\text{par}(\overline{d})=\overline{\text{par}(d)}$.

In some examples, the code word validator 206 determines whether decoded arrays have N bits with a '1' value. In some examples, the code word validator determines whether any '1' values from a first array change when the first array is decoded. The example code word validator 206 validates potential code words or arrays having N '1's. If the example code word validator 206 identifies a PBECC word and/or PBECC word locations, the example code word validator 206 logs the PBECC word and/or PBECC word locations in the example code word database 210.

The example counter 208 initializes and maintains one or more counts. In some examples, the counter 208 increments and/or decrements variables, such as, for example, I, S, X, Y. In some examples, the counter 208 compares variables and/or equations including the variables to other variables and/or threshold values. In some examples, the counter 208 counts the number of PBECC words and/or locations. In such examples, the counter 208 compares the number of PBECC words and/or locations to a threshold value (e.g., 16). If the counter 208 determines that the number of PBECC words and/or locations is less than the threshold value, the example code searcher 108 continues looking for PBECC within the example mother ECC code 126.

The example code word database 210 stores PBECC words and/or locations in mother ECC code 126 corresponding to PBECC. In the illustrated example, the example code word database 210 is a storage device (e.g., a hard drive, solid state drive, floppy disk, compact disk, Blu-ray disk, RAID system, digital versatile disk (DVD), etc.) disposed within the example code search 108. Alternatively, the code word database 210 may be hosted and/or controlled by a third party (e.g., an external storage device connectable through a network).

Figure 3:
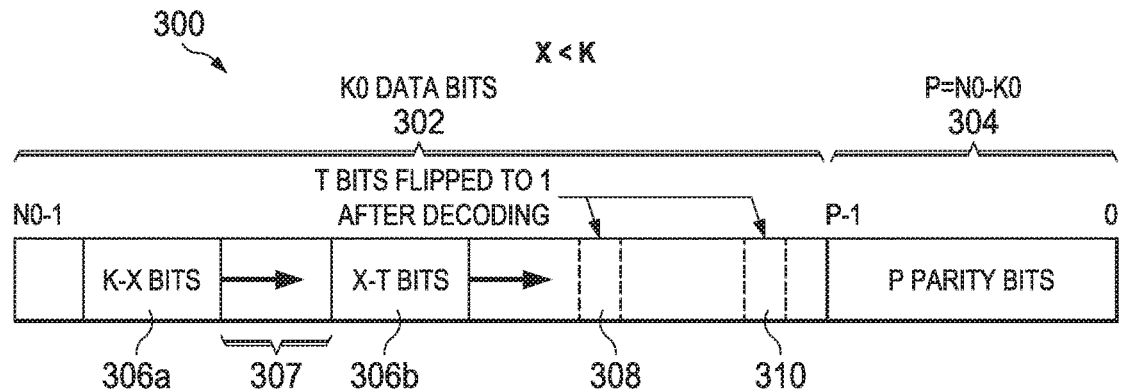
FIGS. 3-4 are block diagrams illustrating example implementations of the example code searcher of FIG. 2.
Figure 4:
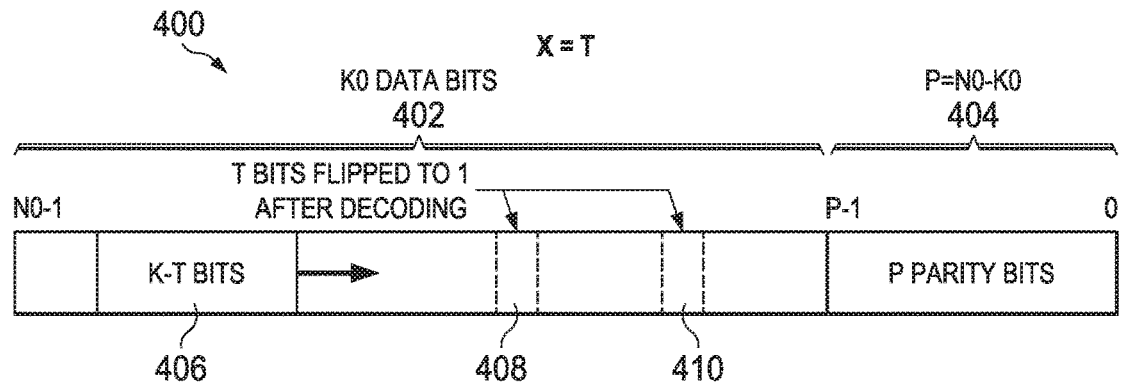

FIGS. 3-4 are block diagrams illustrating example implementations of the example code searcher 108 of FIG. 2. In operation, the example array builder 200 receives a mother ECC code 126 (FIG. 1). The example array builder 200 builds an array 300 (FIG. 3) within the example mother ECC code 126 having K0 data bits 302 and P parity bits 304 (e.g., P=N0–K0).

In some examples (e.g., when K>X>t), the example array builder 200 creates multiple segments, such as, for example, segments 306a, 306b (FIG. 3). In some examples, the number of bits within segments 306a, 306b total N bits. In the illustrated example of FIG. 3, the number of bits within segments 306a and 306b total K–t bits. In some examples, the segments 306a, 306b are separated by a distance 307. In some examples, the value setter 202 sets the values within the segments 306a, 306b to '1,' and sets all other locations to '0.' In such examples, N bits having a value of '1' may be located within segments 306a, 306b. The example code word validator 206 determines whether the array including the segments having '1' values and the rest of the bits having '0' values satisfies a parity check. If the example code word validator 206 determines that the array satisfies the parity check, then the example code word validator 206 determines that the bit locations where the '1' values are located in the array correspond to locations where polarity-based error correction code exists.

In some examples, the value setter 202 sets the values within the segments 306a, 306b to '1,' the values within the parity bits 304 to '1,' and sets all other locations to '0.' In some examples, the example decoder 204 corrects t bits 308, 310 during decoding of the array 300. In such examples, N bits having a value of '1' are located within segments 306a, 306b, the parity bits 304, and the corrected t bits 308, 310. In some examples, the example code word validator 206 determines whether the array including N bits having a value of '1' satisfies a parity check. If the example code word validator 206 determines that the array satisfies the parity check, then the example code word validator 206 determines that the bit locations where the '1' values are located in the array correspond to locations where polarity-based error correction code exists.

The example array builder 200 builds an array 400 (FIG. 4) within the example mother ECC code 126 having K0 data bits 402 and P parity bits 404 (e.g., P=N0–K0). In some examples (e.g., when X=t), the example array builder 200 creates one segment, such as, for example, segment 406 (FIG. 4). In some examples, the number of bits within segment 406 totals N bits. In such examples, the value setter 202 sets the values within segment 406 to '1,' and sets all other locations to '0.' The example code word validator 206 determines whether the array including segment 406 having '1' values and the rest of the bits having '0' values satisfies a parity check. If the example code word validator 206 determines that the array satisfies the parity check, then the example code word validator 206 determines that the bit locations where the '1' values are located in the array (e.g., segment 406) correspond to locations where polarity-based error correction code exists.

In the illustrated example of FIG. 4, the number of bits within segments 406 totals K–t bits. In some examples, the value setter 202 sets the values within segment 406 to '1,' sets the parity bits 404 to '1,' and sets all other bit locations to '0.' In some examples, the example decoder 204 corrects t bits 408, 410 during decoding of the array 400. In such examples, N bits having a value of '1' are located within segment 406, the parity bits 404, and the corrected t bits 408, 410. In some examples, the example code word validator 206 determines whether the array including N bits having a value of '1' satisfies a parity check. If the example code word validator 206 determines that the array satisfies the parity check, then the example code word validator 206 determines that the bit locations where the '1' values are located in the array correspond to locations where polarity-based error correction code exists.

While the example segments 306a, 306b, 406 and example t bits 308, 310, 408, 410 are illustrated in locations, the locations where the example segments 306a, 306b, 406 and example t bits 308, 310, 408, 410 are illustrated may vary. As disclosed herein, t errors may occur anywhere in a code word. Additionally, the examples segments 306a, 306b, 406 may be arranged anywhere within the example arrays 300, 400, respectively. While examples disclosed herein express code and/or code words in terms of bits, code and/or code words may include symbols of any size (e.g., bits, bytes, megabytes, etc.).

As disclosed herein, many different mother ECC codes may be used to encode and decode information. For example, single error correction (SEC) BCH code has the parameters defined in Table 2:

TABLE 2

| | |
|---|---|
| Data-word length | $K0 = 2^{m+1} - m - 2$ |
| Data array | $[d_{K0-1}, \ldots, d_1, 0]$ |
| Data polynomial | $d(x) = d_{K0-1}x^{K0-1} + \ldots + d_1x + d_0$ |
| Parity-word length | $P = m + 1$ |
| Code word length | $N0 = 2^{m+1} - 1$ |
| Code word array | $[c_{N0-1}, \ldots, c_{m+2}, c_{m+1}, c_m, \ldots, c_1, c_0]$ where $c_{m+1+i} = d_i$ for $0 \le i < K0$ |
| Parity word polynomial | $r(x) = d(x) \cdot x^{m+1} \mod g(x) = c_m x^m + \ldots + c_1 x + c_0$ |
| Generator polynomial | $g(x) = p(x) = p_{m+1}x^{m+1} + \ldots + p_1 x + p_0$ |
| Parity check equation | $[\alpha^{N0-1} \ \alpha^{N0-2} \ \ldots \ \alpha^0 \ \alpha^1] \begin{bmatrix} c_{N0-1} \\ c_{N0-2} \\ \vdots \\ c_0 \end{bmatrix} = 0$ |

As used herein, a is the primitive root of the generator polynomial in $GF(2^{m+1})$. In some examples, the encoding process for SEC BCH includes finding the parity symbols $[c_m, \ldots, c_1, c_0]$, such that $c(x) = c_{N0-1}x^{N0-1} + \ldots + c_1 x + c_0 \equiv 0$ mod $g(x)$.

In some examples, an uniform shortened single error correction-double error detection ("SEC-DED") BCH code has the parameters defined in Table 3:

TABLE 3

| | |
|---|---|
| Data-word length | $K = 2^m$ |
| Data array | $[d_{2^m-1}, \ldots, d_1, d_0]$, |
| Data polynomial | $d(x) = d_{K-1}x^{K-1} + \ldots + d_1x + d_0$ |
| Parity-word length | $P = m + 1$ |
| Code word length | $N = 2^m + m + 1$ |
| Code word array | $[c_{2^m+m}, \ldots, c_{m+2}, c_{m+1}, c_m, \ldots, c_1, c_0]$, |
| Parity word polynomial | $r(x) = d(x) \cdot x^{m+1} \bmod g(x) = c_m x^m + \ldots + c_1 x + c_0$ |
| Generator polynomial | $g(x) = p(x) = p_{m+1}x^{m+1} + \ldots + p_1x + p_0$ |
| Parity check equation | $\begin{bmatrix} \alpha^{N-1} & \alpha^{N-2} & \cdots & \alpha^0 \end{bmatrix} \begin{bmatrix} c_{N-1} \\ c_{N-2} \\ \vdots \\ c_0 \end{bmatrix} = 0$ |

In some examples, the encoding process can be viewed as finding parity symbols $[c_m, \ldots, c_1, c_0]$, such that $c(x) = c_{N-1}x^{N-1} + \ldots + c_1x + c_0 \equiv 0 \bmod g(x)$, where $c_{m+1+i} = d_i$ for $0 \leq i < 2^m - 1$. As disclosed herein, the example code searcher 108 attempts to locate an all '1' code word of length N (e.g., $I_N$) within the standard shortened SEC BCH. However, the standard shortened SEC BCH code does not include $I_N$ as a valid code word, and thus cannot be used as PBECC.

In some examples, a shortened SEC code with a polarity indicator has the parameters defined in Table 4:

TABLE 4

| | |
|---|---|
| Data-word length | $K = 2^m + 1$ |
| Data array | $[d_2m, \ldots, d_1, d_0]$, |
| Data polynomial | $d(x) = d_{K-1}x^{K-1} + \ldots + d_1x + d_0$ |
| Parity-word length | $P = m + 1$ |
| Code word length | $N = 2^m + m + 2$ |
| Code word array | $[c_{2^m+m+1}, \ldots, c_{m+2}, c_{m+1}, c_m, \ldots, c_1, c_0]$, where $c_{m+1+i} = d_i$ for $0 \leq i < 2^m - 1$ |
| Parity word polynomial | $r(x) = d(x) \cdot x^{m+1} \bmod g(x) = c_m x^m + \ldots + c_1 x + c_0$ |
| Generator polynomial | $g(x) = p(x) = p_{m+1}x^{m+1} + \ldots + p_1x + p_0$ |
| Parity check equation | $\begin{bmatrix} \alpha^{i_{N-1}} & \alpha^{i_{N-2}} & \cdots & \alpha^{i_0} \end{bmatrix} \begin{bmatrix} c_{N-1} \\ c_{N-2} \\ \vdots \\ c_0 \end{bmatrix} = 0$ |
| | Where $i_j$ is the location for j-th bit determined by the example code searcher 108 ($0 \leq i_j \leq N0 - 1$, $\forall 0 \leq j < N$) |

In some examples, a SEC-DED code based on extended BCH code has the parameters defined in Table 5:

TABLE 5

| | |
|---|---|
| Data-word length | $K0 = 2^{m+1} - m - 3$ |
| Data array | $[d_{K0-1}, \ldots, d_1, d_0]$ |
| Data polynomial | $d(x) = d_{K0-1}x^{K0-1} + \ldots + d_1x + d_0$ |
| Parity-word length | $P = m + 2$ |
| Code word length | $N0 = 2^{m+1} - 1$ |
| Code word array | $[c_{N0-1}, \ldots, c_{m+3}, c_{m+2}, c_{m+1}, \ldots, c_1, c_0]$ where $c_{m+2+i} = d_i$ for $0 \leq i < K0$ |
| Parity word polynomial | $r(x) = d(x) \cdot x^{m+2} \bmod g(x) = c_{m+1}x^{m+1} + \ldots + c_1x + c_0$ |
| Generator polynomial | $g(x) = p(x) \cdot (x + 1)$ where $p(x) = p_{m+1}x^{m+1} + \ldots + p_1x + p_0$ |
| Parity check equation | $\begin{bmatrix} \alpha^{N0-1} & \alpha^{N0-2} & \cdots & \alpha^0 \\ 1 & 1 & \cdots & 1 \end{bmatrix} \begin{bmatrix} c_{N0-1} \\ c_{N0-2} \\ \vdots \\ c_0 \end{bmatrix} = 0$ |

In some examples, the encoding process can be viewed as finding the parity symbols $[c_{m+1}, \ldots, c_1, c_0]$, such that $c(x) = c_{N0-1}x^{N0-1} + \ldots + c_1x + c_0 \equiv 0 \bmod g(x)$.

In some examples, a shortened SEC-DED code based on extended BCH code has the parameters defined in Table 6:

TABLE 6

| | |
|---|---|
| Data-word length | $K = 2^m$ |
| Data array | $[d_{2^m-1}, \ldots, d_1, d_0]$ |
| Data polynomial | $d(x) = d_{K-1}x^{K-1} + \ldots + d_1x + d_0$ |
| Parity-word length | $P = m + 2$ |
| Code word length | $N = 2^m + m + 2$ |
| Code word array | $[c_{2^m+m+1}, \ldots, c_{m+3}, c_{m+2}, c_{m+1}, \ldots, c_1, c_0]$ |
| Parity word polynomial | $r(x) = d(x) \cdot x^{m+1} \bmod g(x) = c_m x^m + \ldots + c_1 x + c_0$ |
| Generator polynomial | $g(x) = p(x) = p_{m+1}x^{m+1} + \ldots + p_1x + p_0$ |
| Parity check equation | $\begin{bmatrix} \alpha^{N-1} & \alpha^{N-2} & \cdots & \alpha^0 \\ 1 & 1 & \cdots & 1 \end{bmatrix} \begin{bmatrix} c_{N-1} \\ c_{N-2} \\ \vdots \\ c_0 \end{bmatrix} = 0$ |

In some examples, the encoding process can be viewed as finding the parity symbols $[c_{m+1}, \ldots, c_1, c_0]$, such that $c(x) = c_{N-1}x^{N-1} + \ldots + c_1x + c_0 \equiv 0 \bmod g(x)$, where $c_{m+2+i} = d_i$ for $0 \leq i < 2^m - 1$. As disclosed herein, the example code searcher 108 attempts to locate an all '1' code word of length N (e.g., $I_N$) within the standard shortened SEC-DED code based on extended BCH. However, the standard shortened SEC-DED code based on extended BCH does not include $I_N$ as a valid code word, and thus cannot be used as PBECC.

In some examples, a shortened SEC-DED code with a polarity indicator has the parameters defined in Table 7:

TABLE 7

| | |
|---|---|
| Data-word length | $K = 2^m + 1$; m odd<br>$K = 2^m + 2$; m even |
| Data array | $[d_{K-1}, \ldots, d_1, d_0]$ |
| Data polynomial | $d(x) = d_{K-1}x^{K-1} + \ldots + d_1x + d_0$ |
| Parity-word length | $P = m + 2$ |
| Code word length | $N = 2^m + m + 3$; m odd<br>$N = 2^m + m + 4$; m even |
| Code word array | $[c_{N-1}, \ldots, c_{m+3}, c_{m+2}, c_{m+1}, \ldots, c_1, c_0]$, where $c_{m+2+i} = d_i$ for $0 \leq i < N - m - 3$ |
| Parity word polynomial | $r(x) = d(x) \cdot x^{m+2} \bmod g(x) = c_m x^{m+1} + \ldots + c_1 x + c_0$ |
| Generator polynomial | $g(x) = (x + 1)p(x)$ where $p(x) = p_{m+1}x^{m+1} + \ldots + p_1x + p_0$ |
| Parity check equation | $\begin{bmatrix} \alpha^{i_{N-1}} & \alpha^{i_{N-2}} & \cdots & \alpha^{i_0} \\ 1 & 1 & \cdots & 1 \end{bmatrix} \begin{bmatrix} c_{N-1} \\ c_{N-2} \\ \vdots \\ c_0 \end{bmatrix} = 0$ |
| | Where $i_j$ is the location for j-th bit determined by the example code searcher 108 ($0 \leq i_j < N0$, $\forall 0 \leq j < N$). |

In some examples, because $I_N$ is a valid code word in PBECC, N is an even number.

In some examples, a shortened SEC-DED code with a polarity indicator has the parameters defined in Table 8:

TABLE 8

| | |
|---|---|
| Data-word length | $K = 2^m + 1$; m even |
| Data array | $[d_{2^m-1}, \ldots, d_1, d_0]$ |
| Data polynomial | $d(x) = d_{K-1}x^{K-1} + \ldots + d_1x + d_0$ |
| Parity-word length | $P = m + 3$; m even |
| Code word length | $N = 2^m + m + 4$; m even |
| Code word array | $[c_{2^m+m+3}, \ldots, c_{m+3}, c_{m+2}, c_{m+1}, \ldots, c_1, c_0]$, where $c_{m+3+i} = d_i$ for $0 \leq i < 2^m$ |
| Parity word polynomial | $r(x) = d(x) \cdot x^{m+3} \bmod g(x) = c_m x^{m+2} + \ldots + c_1 x + c_0$ |

TABLE 8-continued

| | |
|---|---|
| Generator polynomial | $g(x) = (x + 1)p(x)$ where $p(x) = p_{m+2}x^{m+2} + \ldots + p_1 x + p_0$ |
| Parity check equation | $\begin{bmatrix} \alpha^{i_{N-1}} & \alpha^{i_{N-2}} & \cdots & \alpha^{i_0} \\ 1 & 1 & \cdots & 1 \end{bmatrix} \begin{bmatrix} c_{N-1} \\ c_{N-2} \\ \vdots \\ c_0 \end{bmatrix} = 0$ |
| | Where $i_j$ is the location for j-th bit determined by the example code searcher 108 ($0 \leq i_j < 2^{m+2} - 1$, $\forall 0 \leq j < N$). |

In some examples, because $I_N$ is a valid code word in PBECC, N is an even number.

In some examples, a SEC-DED code based on extended BCH code has the parameters defined in Table 9:

TABLE 9

| | |
|---|---|
| Data-word length | $K0 = 2^{m+2} - m - 4$; m even |
| Data array | $[d_{K0-1}, \ldots, d_1, d_0]$ |
| Data polynomial | $d(x) = d_{K0-1}x^{K0-1} + \ldots + d_1 x + d_0$ |
| Parity-word length | $P = m + 3$; m even |
| Code word length | $N0 = 2^{m+2} - 1$; m even |
| Code word array | $c = [c_{N0-1}, \ldots, c_{m+3}, c_{m+2}, c_{m+1}, \ldots, c_1, c_0]$ where $c_{m+2+i} = d_i$ for $0 \leq i < K0$ |
| Parity word polynomial | $r(x) = d(x) \cdot x^{m+3} \mod g(x) = c_{m+2}x^{m+2} + \ldots + c_1 x + c_0$. |
| Generator polynomial | $g(x) = p(x) \cdot (x + 1)$ $p(x) = p_{m+3}x^{m+3} + \ldots + p_1 x + p_0$ |

TABLE 9-continued

| | |
|---|---|
| Parity check equation | $\begin{bmatrix} \alpha^{N0-1} & \alpha^{N0-2} & \cdots & \alpha^0 \\ 1 & 1 & \cdots & 1 \end{bmatrix} \begin{bmatrix} c_{N0-1} \\ c_{N0-2} \\ \vdots \\ c_0 \end{bmatrix} = 0$ |

In some examples, a shortened SEC code with a polarity indicator has the parameters defined in Table 10:

TABLE 10

| | |
|---|---|
| Data-word length | $K = 2^{m+2} - m - 3$; m even |
| Data array | $[d_{2^m-1}, \ldots, d_1, d_0]$ |
| Data polynomial | $d(x) = d_{K-1}x^{K-1} + \ldots + d_1 x + d_0$ |
| Parity-word length | $P = m + 2$; m even |
| Code word length | $N = 2^{m+2} - 1$; m even |
| Code word array | $[c_{2^m+m}, \ldots, c_{m+2}, c_{m+1}, c_m, \ldots, c_1, c_0]$, where $c_{m+2+i} = d_i$ for $0 \leq i < 2^m - 1$ |
| Parity word polynomial | $r(x) = d(x) \cdot x^{m+2} \mod g(x) = c_{m+1}x^{m+1} + \ldots + c_1 x + c_0$ |
| Generator polynomial | $g(x) = p(x) = p_{m+2}x^{m+2} + \ldots + p_1 x + p_0$ |
| Parity check equation | $\begin{bmatrix} \alpha^{i_{N-1}} & \alpha^{i_{N-2}} & \cdots & \alpha^{i_0} \end{bmatrix} \begin{bmatrix} c_{N-1} \\ c_{N-2} \\ \vdots \\ c_0 \end{bmatrix} = 0$ |
| | Where $i_j$ is the location for j-th bit determined by the example code searcher 108 ($0 \leq i_j < N0$, $\forall 0 \leq j < N$) |

In some examples, a double error correction ("DEC") BCH code has the parameters defined in Table 11:

TABLE 11

| | |
|---|---|
| Data-word length | $K0 = 2^{m+1} - 2m - 3$ |
| Data array | $[d_{K0-1}, \ldots, d_1, d_0]$ |
| Data polynomial | $d(x) = d_{K0-1}x^{K0-1} + \ldots + d_1 x + d_0$ |
| Parity-word length | $P = 2m + 2$ |
| Code word length | $N0 = 2^{m+1} - 1$ |
| Code word array | $[c_{N0-1}, \ldots, c_{2m+3}, c_{2m+2}, c_{2m+1}, \ldots, c_1, c_0]$ |
| Parity word polynomial | $r(x) = d(x) \cdot x^{2m+2} \mod g(x) = c_{2m}x^{2m} + \ldots + c_1 x + c_0$ |
| Generator polynomial | $g(x) = LCM\{\phi_1(x), \phi_3(x)\}$ where $\phi_1(x)$ and $\phi_3(x)$ are the minimal polynomial of $\alpha$ and $\alpha^3$, $g(x)$ is the least common multiple (LCM) of the two minimal polynomials $\phi_1(x)$ and $\phi_3(x)$. |
| Parity check equation | $\begin{bmatrix} \alpha^{N0-1} & \alpha^{N0-3} & \cdots & \alpha^0 \\ \alpha^{3(N0-1)} & \alpha^{3(N0-3)} & \cdots & \alpha^0 \end{bmatrix} \begin{bmatrix} c_{N0-1} \\ c_{N0-2} \\ \vdots \\ c_0 \end{bmatrix} = 0$ |

The above DEC BCH code may be based on any 4 consecutive roots $\alpha^b, \ldots, \alpha^{b+3}$. In the illustrated example, b=1. In some examples, the encoding procedure can be viewed as finding parity symbols $[c_{2m+1}, \ldots, c_1, c_0]$, such that $c(x) = c_{N0-1}x^{N0-1} + \ldots + c_1 x + c_0 \equiv 0 \mod g(x)$, where $c_{2m+2+i} = d_i$ for $0 \leq i < K0$.

In some examples, a shortened DEC BCH code has the parameters defined in Table 12:

TABLE 12

| | |
|---|---|
| Data-word length | $K = 2^m$ |
| Data array | $[d_{K-1}, \ldots, d_1, d_0]$ |
| Data polynomial | $d(x) = d_{K-1}x^{K-1} + \ldots + d_1 x + d_0$ |
| Parity-word length | $P = 2m + 2$ |
| Code word length | $N = 2^m + 2m + 2$ |
| Code word array | $[c_{N-1}, \ldots, c_{2m+3}, c_{2m+2}, c_{2m+1}, \ldots, c_1, c_0]$ |
| Parity word polynomial | $r(x) = d(x) \cdot x^{2m+2} \mod g(x) = c_{2m+1}x^{2m+1} + \ldots + c_1 x + c_0$ |

TABLE 12-continued

| | |
|---|---|
| Generator polynomial | $g(x) = \text{LCM}\{\phi_1(x), \phi_3(x)\}$ where $\phi_1(x)$ and $\phi_3(x)$ are the minimal polynomial of $\alpha$ and $\alpha^3$, g(x) is the least common mulple (LCM) of the two minimal polynomials $\phi_1(x)$ and $\phi_3(x)$. |
| Parity check equation | $\begin{bmatrix} \alpha^{N-1} & \alpha^{N-3} & \cdots & \alpha^0 \\ \alpha^{3(N-1)} & \alpha^{3(N-3)} & \cdots & \alpha^0 \end{bmatrix} \begin{bmatrix} c_{N-1} \\ c_{N-2} \\ \vdots \\ c_0 \end{bmatrix} = 0$ |

In some examples, a shortened DEC BCH code with a polarity indicator has the parameters defined in Table 13:

TABLE 13

| | |
|---|---|
| Data-word length | $K = 2^m + 1$ |
| Data array | $[d_{K-1}, \ldots, d_1, d_0]$ |
| Data polynomial | $d(x) = d_{K-1}x^{K-1} + \ldots + d_1 x + d_0$ |
| Parity-word length | $P = 2m + 2$ |
| Code word length | $N = 2^m + 2m + 3$ |
| Code word array | $[c_{N-1}, \ldots, c_{m+3}, c_{m+2}, c_{m+1}, \ldots, c_1, c_0]$ |
| Parity word polynomial | $r(x) = d(x) \cdot x^{2m+2} \bmod g(x) = c_{2m+1}x^{2m+1} + \ldots + c_1 x + c_0$ |
| Generator polynomial | $g(x) = \text{LCM}\{\phi_1(x), \phi_3(x)\}$ where $\phi_1(x)$ and $\phi_3(x)$ are the minimal polynomial of $\alpha$ and $\alpha^3$, g(x) is the least common mulple (LCM) of the two minimal polynomials. |
| Parity check equation | $\begin{bmatrix} \alpha^{i_{N-1}} & \alpha^{i_{N-2}} & \cdots & \alpha^{i_0} \\ \alpha^{3i_{N-1}} & \alpha^{3i_{N-2}} & \cdots & \alpha^{3i_0} \end{bmatrix} \begin{bmatrix} c_{N-1} \\ c_{N-2} \\ \vdots \\ c_0 \end{bmatrix} = 0$ where $i_j$ is the location for j-th bit determinded by the example code searcher 108 $(0 \leq i_j < N0, \forall 0 \leq j < N)$ |

In some examples, a double error correction-triple error detection (DEC-TED) based on extended BCH code has the parameters defined in Table 14:

TABLE 14

| | |
|---|---|
| Data-word length | $K0 = 2^{m+1} - 2m - 4$ |
| Data array | $[d_{K0-1}, \ldots, d_1, d_0]$ |
| Data polynomial | $d(x) = d_{K0-1}x^{K0-1} + \ldots + d_1 x + d_0$ |
| Parity-word length | $P = 2m + 3$ |
| Code word length | $N0 = 2^{m+1} - 1$ |
| Code word array | $[c_{N0-1}, \ldots, c_{m+3}, c_{m+2}, c_{m+1}, \ldots, c_1, c_0]$ |
| Parity word polynomial | $r(x) = d(x) \cdot x^{2m+3} \bmod g(x) = c_{2m+2}x^{2m+2} + \ldots + c_1 x + c_0$ |
| Generator polynomial | $g(x) = p(x) \cdot (x + 1)$ $p(x) = p_{2m+2}x^{2m+2} + \ldots + p_1 x + p_0$ |
| Parity check equation | $\begin{bmatrix} \alpha^{N0-1} & \alpha^{N0-2} & \cdots & \alpha^1 & \alpha^0 \\ \alpha^{-(N0-1)} & \alpha^{-(N0-2)} & \cdots & \alpha^{-1} & \alpha^0 \\ 1 & 1 & \cdots & 1 & 1 \end{bmatrix} \begin{bmatrix} c_{N0-1} \\ c_{N0-2} \\ \vdots \\ c_0 \end{bmatrix} = 0$ |

The above DEC-TED BCH code may be based on any 4 consecutive power of primitive element $\alpha$. An example DEC-TED BCH code is described in U.S. Pat. No. 8,694,872. In the illustrated example, the parity word polynomial is based on roots $\alpha$, $\alpha^{-1}$ and 1. In some examples, the encoding procedure can be viewed as finding parity symbols $[c_{2m+2}, \ldots, c_1, c_0]$, such that $c(x) = c_{N0-1}x^{N0-1} + \ldots + c_1 x + c_0 \equiv 0 \bmod g(x)$ and $c'(x) = c'_0 x^{N0-1} + \ldots + c_{N0-2}x + c_{N0-1} \equiv 0 \bmod g(x)$, where $c_{2m+3+i} = d_i$ for $0 \leq i < K0$.

In some examples, a standard shortened DEC-TED code has the parameters defined in Table 15:

TABLE 15

| | |
|---|---|
| Data-word length | $K = 2^m$ |
| Data array | $[d_{K-1}, \ldots, d_1, d_0]$ |
| Data polynomial | $d(x) = d_{K-1}x^{K-1} + \ldots + d_1 x + d_0$ |
| Parity-word length | $P = 2m + 3$ |
| Code word length | $N = 2^m + 2m + 3$ |
| Code word array | $[c_{N-1}, \ldots, c_{m+3}, c_{m+2}, c_{m+1}, \ldots, c_1, c_0]$ |
| Parity word polynomial | $r(x) = d(x) \cdot x^{2m+3} \bmod g(x) = c_{2m+2}x^{2m+2} + \ldots + c_1 x + c_0$ |
| Generator polynomial | $g(x) = p(x) \cdot (x + 1)$ $p(x) = p_{2m+2}x^{2m+2} + \ldots + p_1 x + p_0$ |
| Parity check equation | $\begin{bmatrix} \alpha^{N-1} & \alpha^{N-2} & \cdots & \alpha^1 & \alpha^0 \\ \alpha^{-(N-1)} & \alpha^{-(N-2)} & \cdots & \alpha^{-1} & \alpha^0 \\ 1 & 1 & \cdots & 1 & 1 \end{bmatrix} \begin{bmatrix} c_{N-1} \\ c_{N-2} \\ \vdots \\ c_0 \end{bmatrix} = 0$ |

In some examples, a shortened DEC-TED code with a polarity indicator has the parameters defined in Table 16:

TABLE 16

| | |
|---|---|
| Data-word length | $K = 2^m + 1$ |
| Data array | $[d_{K-1}, \ldots, d_1, d_0]$ |
| Data polynomial | $d(x) = d_{K-1}x^{K-1} + \ldots + d_1 x + d_0$ |
| Parity-word length | $P = 2m + 3$ |
| Code word length | $N = 2^m + 2m + 4$ |
| Code word array | $[c_{N-1}, \ldots, c_{m+3}, c_{m+2}, c_{m+1}, \ldots, c_1, c_0]$ |
| Parity word polynomial | $r(x) = d(x) \cdot x^{2m+3} \bmod g(x) = c_{2m+2}x^{2m+2} + \ldots + c_1 x + c_0$ |
| Generator polynomial | $g(x) = p(x) \cdot (x + 1)$ $p(x) = p_{2m+2}x^{2m+2} + \ldots + p_1 x + p_0$ |

TABLE 16-continued

Parity check equation
$$\begin{bmatrix} \alpha^{i_{N-1}} & \alpha^{i_{N-2}} & \cdots & \alpha^{i_0} \\ \alpha^{-i_{N-1}} & \alpha^{-i_{N-2}} & \cdots & \alpha^{-i_0} \\ 1 & 1 & \cdots & 1 \end{bmatrix} \begin{bmatrix} c_{N-1} \\ c_{N-2} \\ \vdots \\ c_0 \end{bmatrix} = 0$$

where $i_j$ is the location for j-th bit determined by the example code searcher 108 ($0 \leq i_j < N0, \forall 0 \leq j < N$).

In some examples, because $I_N$ is a valid code word in PBECC, N is an even number. Although each of the above Tables 2-16 include a data word of K bits, K may be any number less than the number of bits used in the original mother code before shortening.

While an example manner of implementing the example code searcher 108 of FIG. 1 is illustrated in FIG. 2, one or more of the elements, processes and/or devices illustrated in FIG. 2 may be combined, divided, re-arranged, omitted, eliminated and/or implemented in any other way. Further, the example array builder 200, the example value setter 202, the example ECC decoder 204, the example code word validator 206, the example counter 208, the example code word database 210, and/or, more generally, the example code searcher 108 of FIG. 2 may be implemented by hardware, software, firmware and/or any combination of hardware, software and/or firmware. Thus, for example, any of the example array builder 200, the example value setter 202, the example ECC decoder 204, the example code word validator 206, the example counter 208, the example code word database 210, and/or, more generally, the example code searcher 108 of FIG. 2 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example, the example array builder 200, the example value setter 202, the example ECC decoder 204, the example code word validator 206, the example counter 208, the example code word database 210 is/are hereby expressly defined to include a tangible computer readable storage device or storage disk such as a memory, a digital versatile disk (DVD), a compact disk (CD), a Blu-ray disk, etc. storing the software and/or firmware. Further still, the example code searcher 108 of FIG. 1 may include one or more elements, processes and/or devices in addition to, or instead of, those illustrated in FIG. 2, and/or may include more than one of any or all of the illustrated elements, processes and devices.

Figure 5:
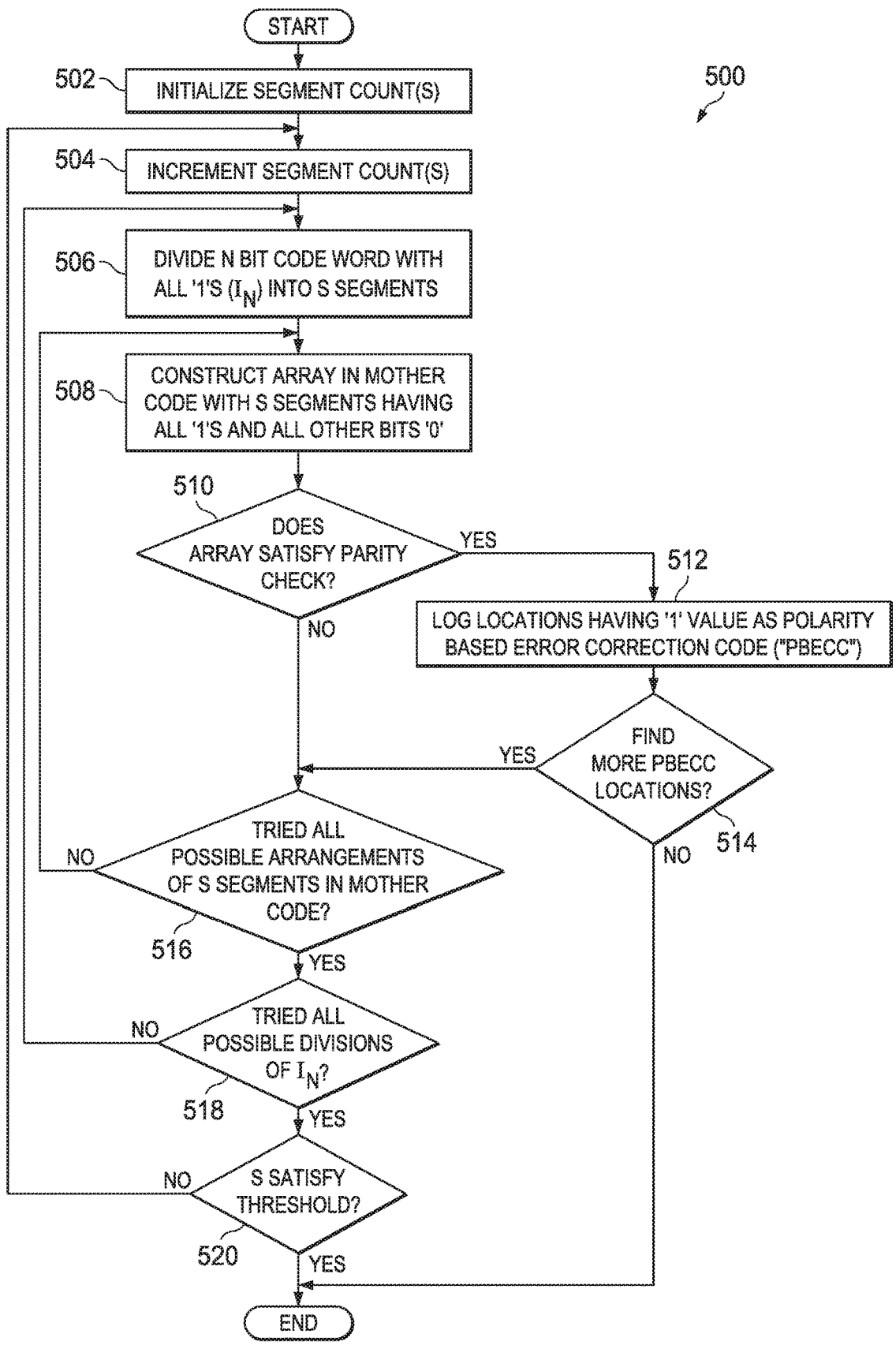
FIGS. 5-6 are flowcharts illustrating example instructions to implement the example code searcher of FIG. 2.
Figure 6:
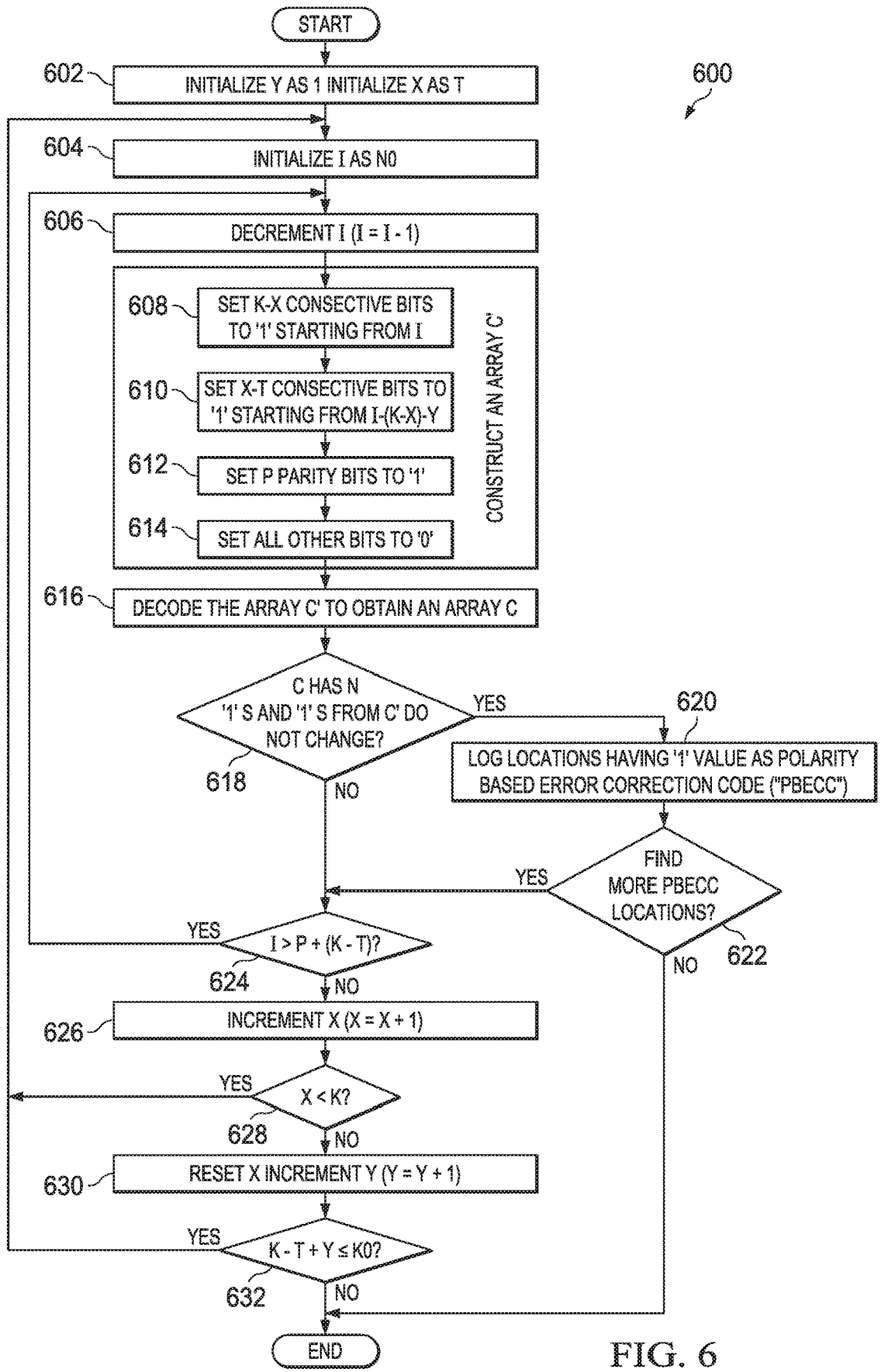

Flowcharts representative of example machine readable instructions for implementing the example code searcher 108 of FIGS. 1-2 are shown in FIGS. 5-6. In some examples, the machine readable instructions comprise a program for execution by a processor such as the processor 912 shown in the example processor platform 900 discussed below in connection with FIG. 9. The program may be embodied in software stored on a tangible computer readable storage medium such as a CD-ROM, a floppy disk, a hard drive, a digital versatile disk (DVD), a Blu-ray disk, or a memory associated with the processor 912, but the entire program and/or parts thereof could alternatively be executed by a device other than the processor 912 and/or embodied in firmware or dedicated hardware. Further, although the example programs are described with reference to the flow-charts illustrated in FIG. 5-6, many other methods of implementing the example code searcher 108 may alternatively be used. For example, the order of execution of the blocks may be changed, and/or some of the blocks described may be changed, eliminated, or combined.

Figure 7:
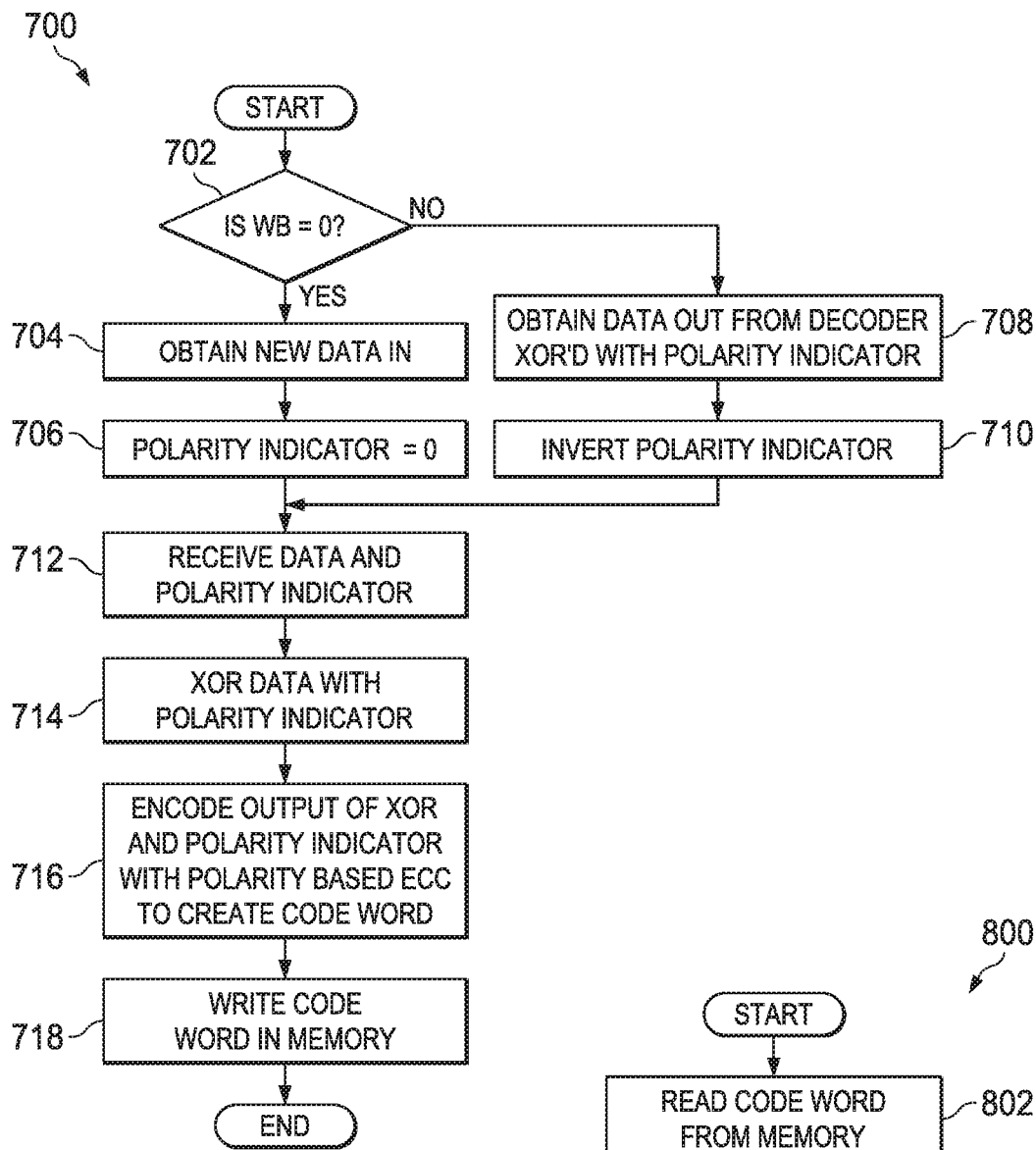
FIG. 7-8 are flowcharts illustrating example instructions to implement the example controller of FIG. 1.
Figure 8:
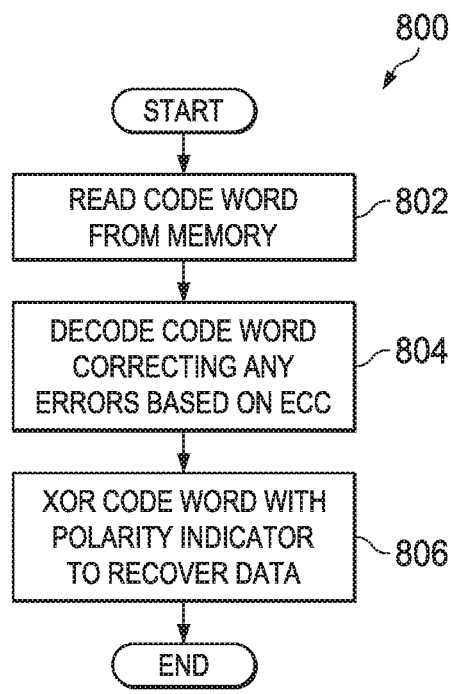

Flowcharts representative of example machine readable instructions for implementing the example controller 102 of FIG. 1 are shown in FIGS. 7-8. In some examples, the machine readable instructions comprise a program for execution by a processor such as the processor 912 shown in the example processor platform 900 discussed below in connection with FIG. 9. The program may be embodied in software stored on a tangible computer readable storage medium such as a CD-ROM, a floppy disk, a hard drive, a digital versatile disk (DVD), a Blu-ray disk, or a memory associated with the processor 912, but the entire program and/or parts thereof could alternatively be executed by a device other than the processor 912 and/or embodied in firmware or dedicated hardware, such as, for example, the logic circuit shown in FIG. 1. Further, although the example programs are described with reference to the flowcharts illustrated in FIG. 7-8, many other methods of implementing the example controller 102 may alternatively be used. For example, the order of execution of the blocks may be changed, and/or some of the blocks described may be changed, eliminated, or combined.

As mentioned above, the example processes of FIGS. 5-8 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and transmission media. As used herein, "tangible computer readable storage medium" and "tangible machine readable storage medium" are used interchangeably. Additionally or alternatively, the example processes of FIGS. 5-8 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and transmission media. As used herein, when the phrase "at least" is used as the transition term in a preamble of a claim, it is open-ended in the same manner as the term "comprising" is open ended.

FIGS. 5-6 are flowcharts illustrating example instructions to implement the example code searcher of FIG. 2. FIG. 5 illustrates example instructions 500 to search for code within the example mother code 126 that satisfies par($\bar{d}$)=$\overline{\text{par}(d)}$. The example instructions 500 begin at block 502. At block 502, the example counter 208 initializes an example segment count (e.g., number of segments S=0). The example counter 208 increments the example segment count (e.g., S=S+1; block 504). The example array builder 200 determines a target length N for a subset of the mother code 126 (e.g., length N0>N). The example value setter 202 creates a code word of N bits each having a logical high value (e.g., '1') ("$I_N$"). The example array builder 200 divides the N bit code word into S segments (block 506). The example array builder 200 creates an array in a first arrangement within the mother code 126 by arranging the S segments into the mother code 126 and instructing the value setter 200 to set all other bits to '0' (block 508). Alternatively, the S segments in the mother code 126 may have a logical low value and all other bits in the mother code 126 may have a logical high value. The example code word validator 206 determines whether the array satisfies a parity check (block 510). For example, an example parity check may be defined by Equation 1:

$$[\alpha^{N0-1} \; \alpha^{N0-3} \; \ldots \; \alpha^1 \; \alpha^0] \begin{bmatrix} c_{N0-1} \\ c_{N0-2} \\ \vdots \\ c_0 \end{bmatrix} = 0 \quad \text{Equation 1}$$

However, different ECC may have different parity check equations, such as, for example, those disclosed in Tables 2-16. If the example code word validator 206 determines that the array satisfies the parity check (block 510: YES), then the example code word validator 206 determines that the bit locations where the '1' values are located in the array correspond to locations where polarity-based error correction code exists. For example, while the aforementioned example identifies a valid polarity-based error correction code word having all '1's, other code words formed at those locations not having all '1's are also valid polarity-based error correction code words. Thus, the example code word validator 206 logs the bit locations where a valid all '1' code word exists (block 512) into the example code word database 210 as polarity-based error correction code. While examples disclosed herein express code and/or code words in terms of bits, code and/or code words may include symbols of any size (e.g., bits, bytes, megabytes, etc.).

In some examples, there is not just one set of locations where valid polarity-based error correction code exists within a mother ECC code. Therefore, the example counter 208 determines whether to search for additional locations corresponding to PBECC words (block 514). In some examples, the counter 208 compares the number of identified valid PBECC word locations to a threshold. If the example counter 208 determines to search for additional locations corresponding to PBECC words (block 514: YES), control proceed to block 516. If the example counter 208 determines not to search for additional locations corresponding to PBECC words (block 514: NO), the example instructions 500 cease execution.

If the example code word validator 206 determines that the array does not satisfy the parity check (block 510: NO), then the example code word validator 206 determines that the bit locations where the '1' values are located in the array do not correspond to locations where polarity-based error correction code exists (e.g., no valid PBECC words exist at those locations). If additional locations corresponding to PBECC words are to be found (block 514: YES) or if the example code word validator 206 determines that the bit locations where the '1' values are located in the array do not correspond to locations where PBECC exists (block 510: NO), control proceeds to block 516. At block 516, the example array builder 200 determines whether all possible arrangements of the S segments within the example mother code 126 have been attempted. If not (block 516: NO), control returns to block 518 where the example array builder 200 creates an array having a second arrangement different from the first arrangement.

If all possible arrangements of the S segments have been attempted (block 516: YES), the example array builder 200 determines whether all possible divisions of the N bits into S segments have been attempted (block 518). For example, the S segments do not all have to be of the same length. In examples wherein N is four and S is two, the two segments can both have a length of two, one segment may have a length of 1 and the other may have a length of 3, etc. Therefore, if the example array builder 200 determines all possible divisions of the N bits into S segments have not been attempted (block 518: NO), control returns to block 506 where the example array builder 200 divides the N bit code word $I_N$ into different S segments. However, if the example array builder 200 determines all possible divisions of the N bits into S segments have been attempted (block 518: YES), control proceeds to block 520. At block 520, the example counter 208 determines whether S satisfies a threshold. For example, S may not be larger than N. However, any threshold may be used. If the example counter 208 determines S does not satisfy the threshold (block 520: NO), control returns to block 504, where the example counter 208 increments the segment count S. If the example counter 208 determines S satisfies the threshold (block 520: YES), the example instructions 500 cease execution. As disclosed herein, although example instructions 500 are illustrated as iterative serial loops, one or more blocks of the example instructions 500 may be performed in parallel. For example, all possible divisions of N into S segments and/or all possible arrangements of S segments in the mother code 126 may be validated by the code word validator in parallel instead of serially.

FIG. 6 illustrates alternative instructions 600 to search for code within the example mother code 126 that satisfies par($\bar{d}$)=$\overline{\text{par}(d)}$. In some examples, the example code searcher 108 identifies shortened code words of N bits (e.g., 6 bits) having K data bits (e.g., 4 bits) and P parity bits (e.g., 2 bits) from the example mother ECC code of (e.g., 8) with K0 data bits (e.g., 6 bits) and P0 parity bits (e.g., 2 bits). At block 602, the example counter 208 initializes a variable Y to '1.' In some examples, the variable Y corresponds to the distance 307 between first segment 306a (e.g., K–X bits) and second segment 306b (e.g., X–t bits). At block 602, the example counter 208 initializes a variable X to t, wherein t corresponds to the number of errors correctable by the example mother ECC code 126 (e.g., 1). In some examples, the variable X corresponds to a segment boundary, as further described below. At block 604, the example counter 208 initializes a variable I as N0 corresponding to a length of the example mother code 126 (e.g., 8).

At block 606, the example counter 208 decrements the variable I (e.g., I=I−1) (block 606). In some examples, the initial decrement of the variable I identifies the leftmost bit of the example mother ECC code (e.g., N0−1=bit 7) as a starting point for the code searching. The example array builder 200 constructs an array C' within the example mother ECC code 126 of N0 bits (e.g., 8) with K0 data bits (e.g., 6 bits) and P0 parity bits (e.g., 2 bits). The example value setter 202 sets K−X (e.g., 3) consecutive bits to '1' starting from I (e.g., N0−1=bit 7 during the initial loop iteration) (block 608). In the illustrated example, the array builder 200 sets X−t (e.g., 0 bits) consecutive bits to '1' starting from I−(K−X)−Y (e.g., 7−3−1=bit 3) (block 610). In some examples, when X<K, K−X and X−t are distinct segments separated by distance 307 (e.g., Y) and the example code searcher 108 has an implementation corresponding to FIG. 3.

In some examples, blocks 608 and 610 can be merged. For example, when X=t, K−X becomes K−t and X−t becomes zero. In such examples, the example code searcher 108 has an implementation corresponding to FIG. 4. Additionally or alternatively, additional segments may be added so long as the number of bits in all segments equals K−t. While the above examples disclose two segments K−X and X−t, three segments K−X, X−W, and W−t may be used to increase the number of segments. For example, S segments, as discussed in conjunction with FIG. 5, may be created.

At block 612, the example value setter 202 sets the P parity bits to '1.' In the illustrated example, P=P0 both in length and position (e.g., the rightmost P bits: P−1 to 0). The example value setter 202 sets the remaining bits to '0' (block 614). Thus, in the illustrated example, the array C' has K−t+P bits set to '1' and N0−(K−t+P) bits set to '0.' In some examples, the array C' is a mother ECC code word with t errors. In such examples, the example ECC decoder 204 decodes the array C' to obtain an array C having t errors corrected (block 616).

The example code word validator 206 determines whether the array C has N bits with a '1' value and that the '1' values from the array C' did not change (e.g., were not corrected) during decoding (block 618). For example, if array C' was "11100011" and the array C is "11101011," the example code word validator 206 determines that only bit 3 changed (e.g., from '0' to '1'). In such examples, the array C has N bits with a '1' value and the '1' values from the array C' did not change. In contrast, if array C' was "11100011" and the array C is "10100011," the example code word validator 206 determines that bit 6 changed (e.g., from '1' to '0'). In such examples, the array C does not have N bits with a '1' value and at least one of the '1' values from the array C' changed.

If the array C has N bits with a '1' value and that the '1' values from the array C' did not change (block 618: YES), the example code word validator 206 determines that the bit locations where the '1' values are located in the array C correspond to locations where polarity-based error correction code exists. For example, while the aforementioned example identifies a valid polarity-based error correction code word having all '1's (e.g., at bits 7, 6, 5, 3, 1, 0), other code words formed at those locations not having all '1's are also valid polarity-based error correction code words. Thus, the example code word validator 206 logs the bit locations where a valid all '1' code word exists (block 620) into the example code word database 210.

In some examples, there is not just one set of locations where valid polarity-based error correction code exists within a mother ECC code. Therefore, the example counter 208 determines whether to search for additional locations corresponding to code words (block 622). In some examples, the counter 208 compares the number of identified valid code word locations to a threshold. If the example counter 208 determines to search for additional locations corresponding to code words (block 622: YES), control proceed to block 624. If the example counter 208 determines not to search for additional locations corresponding to code words (block 622: NO), the example instructions 600 cease execution.

At block 624, the example counter 208 determines whether the variable I is greater than the sum of the number of parity bits (e.g., P) and the difference of the number of data bits (e.g., K) and errors (e.g., t) (e.g., I>P+(K−t)). If I is greater than P+(K−t) (block 624: YES), then control returns to block 606. Otherwise (block 624: NO), control proceeds to block 626. At block 626, the example counter 208 increments the variable X (e.g., X=X+1) and control proceeds to block 628. The example counter 208 determines whether the variable X is less than the number of data bits K (bock 628). If X is less than K (block 628: YES), control returns to block 604. In some examples, the variation in the size of the variable X changes the length of segments 306a and 306b, such that additional searching can occur. If X is equal to or greater than K (block 628: NO), control proceeds to block 630.

At block 630, the example counter 208 resets the variable X to t and increments the variable Y (e.g., Y=Y+1). In some examples, resetting X and incrementing Y changes the distance 307 between segments 306a and 306b, such that additional searching can occur. The example counter 208 determines whether the sum of K−t+Y is less than or equal to data bits K0 of the example mother ECC code 126 (block 632). If K−t+Y is less than or equal to K0 (block 632: YES), control returns to block 604. If K−t+Y is more than K0 (block 632: NO), the example instructions 600 cease execution. In some examples, verifying that K−t+Y is less than or equal to K0 focuses the code searching to within the data bits K0 of the example mother ECC code 126 (e.g., the example instructions 600 do not search within parity bits P0). However, alternate searching methods may be utilized including searching within the data bits K0 and the parity bits P0 of the example mother ECC code 126. As disclosed herein, although example instructions 600 are illustrated as iterative serial loops, one or more blocks of the example instructions 600 may be performed in parallel.

FIG. 7-8 are flowcharts illustrating example instructions to implement the example controller of FIG. 1. Example instructions 700 illustrate an example encoding procedure. As discussed in conjunction with FIG. 1, the example data processor 114 sets a WB indicator to '0' or '1' depending on whether new data is to be written into the example memory array 104 or if read data is to be written-back into the example memory array 104. At block 702, if the WB indicator is a '0' (block 702: YES), a write-back is not to be performed. The example first MUX 120 selects the new data (e.g., data-in) (block 704). The example second MUX 122 selects ground (e.g., '0') (block 706).

However, if the WB indicator is a '1' (block 702: NO) a write-back is to be performed. The first MUX 120 selects the output of the example first XOR gate 116 (e.g., data-out from decoder XOR'd with polarity indicator(s)) (block 708). The example inverter 124 inverts the polarity indicator(s) received from the example ECC decoder 112. At block 712, the example second XOR gate 118 receives data from blocks 704, 706 or blocks 708, 710, depending on the WB indicator. The example second XOR gate 118 determines the exclusive-or of the received data (e.g., data and polarity indicator(s)) (block 714). The example ECC encoder 112 encodes the output of the example second XOR gate 118 and the polarity indicator(s) with the non-uniform modified ECC code 128 (e.g., polarity-based ECC) to create a code word (block 716). The example ECC encoder 112 writes, or otherwise stores, the created code word into the example memory array 104. The example instructions 700 cease execution.

Example instructions 800 illustrate an example decoding procedure. At block 802, the example ECC decoder 110 reads the code word from the example memory array 104. In some examples, this read is a destructive read, causing the portion of the memory array previously storing the code word to be cleared, erased, or otherwise destructed. The example ECC decoder decodes the code word into corresponding data symbols and polarity indicator(s) based on the non-uniform modified ECC code 128 and corrects up to t errors during decoding (block 804). The example first XOR gate 116 determines the exclusive-or of the data symbols and the polarity indicator(s) to recover the originally stored data, whether inverted or not (block 806). Thereafter, the example instructions 800 cease execution. Example instructions 700, 800 may repeat in a cycle continuously as write-backs and/or new writes are needed. For example, first example instructions 700 may be executed, then example instructions 800, then example instructions 700, etc. Additionally or alternatively, example instructions 700, 800 may be executed in parallel.

Figure 9:
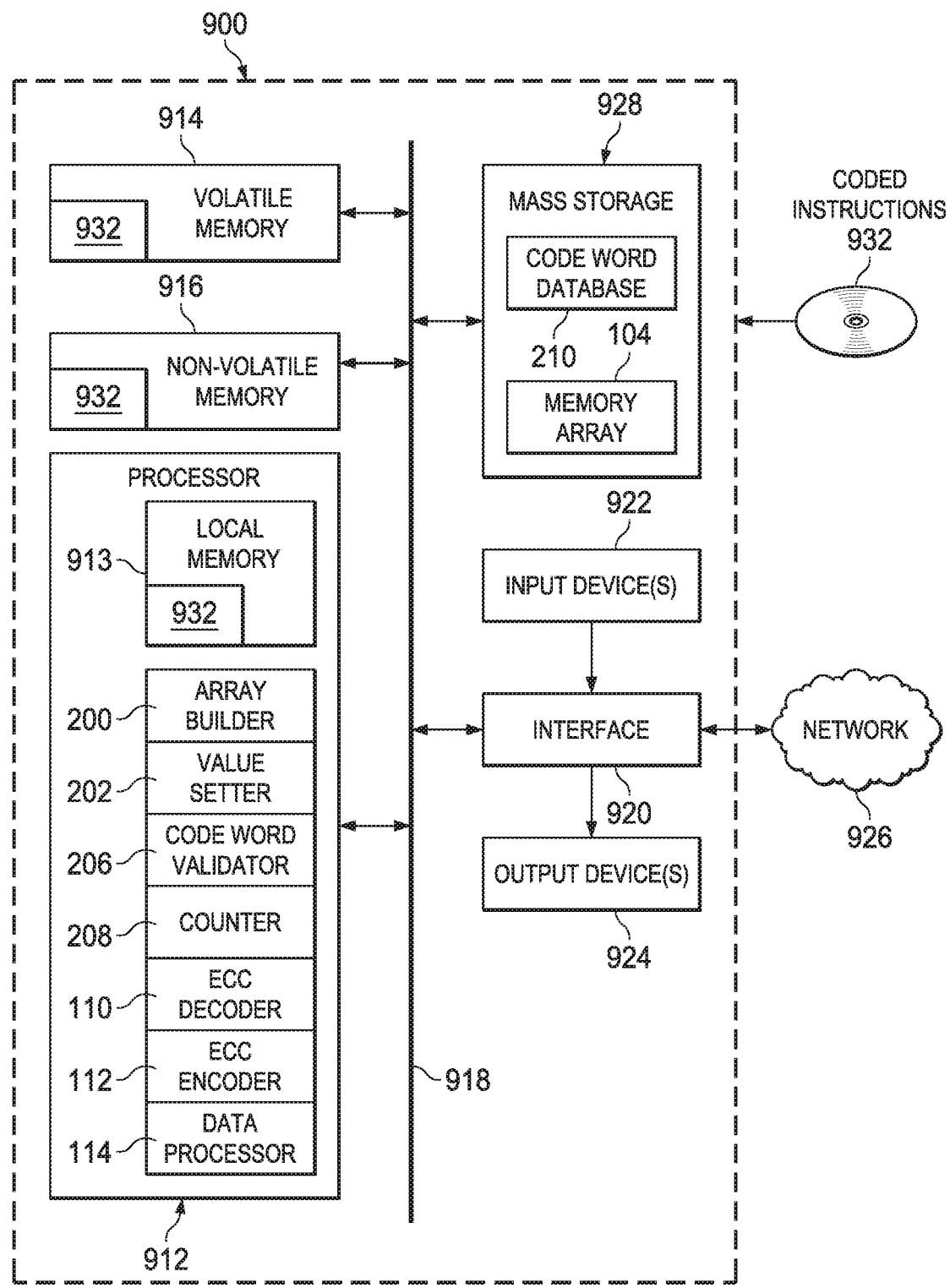
FIG. 9 is a block diagram of an example processor platform to implement the example flowcharts of FIGS. 5-8 to implement the example code searcher of FIG. 2 and the example controller of FIG. 1.

FIG. 9 is a block diagram of an example processor platform 900 capable of executing the instructions of FIGS. 5-8 to implement the controller of FIG. 1. The processor platform 900 can be, for example, a server, a personal computer, a mobile device (e.g., a cell phone, a smart phone, a tablet such as an iPad™), a personal digital assistant (PDA), an Internet appliance, a digital video recorder, a gaming console, a personal video recorder, a set top box, or any other type of computing device.

The processor platform 900 of the illustrated example includes a processor 912. The processor 912 of the illustrated example is hardware. For example, the processor 912 can be implemented by one or more integrated circuits, logic circuits, microprocessors or controllers from any desired family or manufacturer. The example processor 912 can implement the example array builder 200 (FIG. 2), the example value setter 202 (FIG. 2), the example code word validator 206 (FIG. 2), the example counter 208 (FIG. 2), the example ECC decoder 110 (FIG. 1) (or the example ECC decoder 204 (FIG. 2)), the example ECC encoder 112 (FIG. 1), and the example data processor 114 (FIG. 1).

The processor 912 of the illustrated example includes a local memory 913 (e.g., a cache). The processor 912 of the illustrated example is in communication with a main memory including a volatile memory 914 and a non-volatile memory 916 via a bus 918. The volatile memory 914 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 916 may be implemented by flash memory and/or any other desired type of memory device. Access to the main memory 914, 916 is controlled by a memory controller.

The processor platform 900 of the illustrated example also includes an interface circuit 920. The interface circuit 920 may be implemented by any type of interface standard, such as an Ethernet interface, a universal serial bus (USB), and/or a PCI express interface.

In the illustrated example, one or more input devices 922 are connected to the interface circuit 920. The input device(s) 922 permit(s) a user to enter data and commands into the processor 912. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 924 are also connected to the interface circuit 920 of the illustrated example. The output devices 1024 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). The interface circuit 920 of the illustrated example, thus, typically includes a graphics driver card, a graphics driver chip or a graphics driver processor.

The interface circuit 920 of the illustrated example also includes a communication device such as a transmitter, a receiver, a transceiver, a modem and/or network interface card to facilitate exchange of data with external machines (e.g., computing devices of any kind) via a network 926 (e.g., an Ethernet connection, a digital subscriber line (DSL), a telephone line, coaxial cable, a cellular telephone system, etc.).

The processor platform 900 of the illustrated example also includes one or more mass storage devices 928 for storing software and/or data. Examples of such mass storage devices 928 include floppy disk drives, hard drive disks, compact disk drives, Blu-ray disk drives, RAID systems, and digital versatile disk (DVD) drives. The example code word database 210 and/or the example memory array 104 may be implemented within the example mass storage devices 928.

The coded instructions 932 of FIGS. 5-8 may be stored in the mass storage device 928, in the volatile memory 914, in the non-volatile memory 916, and/or on a removable tangible computer readable storage medium such as a CD or DVD. Additionally or alternatively, the example memory array 104 may be implemented within the volatile memory 914, the non-volatile memory 916, and/or a removable tangible computer readable storage medium such as a CD or DVD.

From the foregoing, it will be appreciated that the above disclosed methods, apparatus and articles of manufacture encode data with an error correction code that is invertible such that the 'imprint' effect in DRNVM (e.g., FeRAM) is reduced and/or prevented, bus power may be minimized, and the data, parity, and polarity indicators are protected from errors. In some examples, the invertible error correction code (e.g., polarity-based ECC) are non-uniformly shortened (e.g., modified) versions of mother ECC code. In such examples, the methods, apparatus and articles of manufacture disclosed herein search for the polarity-based ECC within the mother ECC code. In some examples, the methods, apparatus and articles of manufacture apply polarity-based ECC that was identified within the mother ECC code to inverted and non-inverted data with polarity indicators. Accordingly, the methods, apparatus and articles of manufacture disclosed herein invert data during encoding and decoding and protect both the inverted and non-inverted data with ECC.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:
1. A device comprising:
a memory controller including a decoder, the decoder configured to:
receive a first word from a memory array, in which the first word includes: a first set of data; a first polarity indicator; and a first set of error correction coding

(ECC) data for the first set of data and the first polarity indicator, and the first polarity indicator indicates whether the first set of data and the first set of ECC data are in an inverted form or in a non-inverted form;

receive a second word from the memory array, in which the second word includes: a second set of data; a second polarity indicator; and a second set of ECC data for the second set of data and the second polarity indicator, and the second polarity indicator indicates whether the second set of data and the second set of the ECC data are in an inverted form or in a non-inverted form;

responsive to the first polarity indicator indicating that the first set of data and the first set of ECC data are in the inverted form, determine whether a first error is present in the first set of data in the inverted form using the first set of ECC data in the inverted form; and responsive to the second polarity indicator indicating that the second set of data and the second set of ECC data are in the non-inverted form, determine whether a second error is present in the second set of data in the non-inverted form using the second set of ECC data in the non-inverted form.

2. The device of claim 1, wherein the decoder is further configured to, responsive to the first error being present in the first set of data, correct the first error in the first set of data in the inverted form using the first set of ECC data in the inverted form.

3. The device of claim 2, wherein the memory controller further includes an XOR circuit having first and second inputs, the first and second inputs coupled to the decoder, and the XOR circuit configured to:
receive the first set of data with the first error corrected at the first input;
receive the first polarity indicator at the second input; and
provide the first set of data in the non-inverted form based on performing an XOR operation between the first set of data and the first polarity indicator.

4. The device of claim 3, wherein the XOR circuit is a first XOR circuit, the XOR operation is a first XOR operation, and the memory controller further includes:
a first multiplexer coupled to the first XOR circuit, and the first multiplexer configured to provide the first set of data in the non-inverted form responsive to a write-back signal;
an inverter coupled to the decoder, and the inverter configured to invert the first polarity indicator;
a second multiplexer coupled to the inverter, and the second multiplexer configured to provide the inverted first polarity indicator responsive to the write-back signal; and
a second XOR circuit coupled to outputs of the first and second multiplexers, and the second XOR circuit configured to perform a second XOR operation between the first set of data in the non-inverted form and the inverted first polarity indicator.

5. The device of claim 1, wherein the decoder is further configured to determine whether a third error is present in the first polarity indicator using the first set of ECC data in the inverted form.

6. The device of claim 1, wherein the memory controller further includes an encoder having an encoder output and first and second encoder inputs, the encoder configured to:
receive a third set of data at the first encoder input;
receive a third polarity indicator at the second encoder input; and
responsive to the third polarity indicator indicating that the third set of data is in an inverted form, provide output data to the memory array via the encoder output, in which the output data include: the third set of data in the inverted form; the third polarity indicator; and a third set of ECC data in an inverted form for the third set of data and the third polarity indicator.

7. The device of claim 1, wherein the decoder is further configured to:
receive an ECC code; and
determine whether the first error is present in the first set of data in the inverted form using the ECC code; and
wherein the ECC code is a polarity-based error correction code.

8. The device of claim 1, further comprising the memory array.

9. A memory controller comprising:
a data processor having a processor output, and the data processor configured to provide first and second sets of data;
an XOR circuit having first and second XOR inputs and an XOR output, the first XOR input coupled to the processor output, and the XOR circuit configured to:
receive the first set of data at the first XOR input;
receive a first polarity indicator at the second XOR input, in which the first polarity indicator corresponds to the first set of data;
provide the first set of data in an inverted form at the XOR output based on performing a first XOR operation between the first set of data and the first polarity indicator;
receive the second set of data at the first XOR input;
receive a second polarity indicator at the second XOR input, in which the second polarity indicator corresponds to the second set of data; and
provide the second set of data in a non-inverted form at the XOR output based on performing a second XOR operation between the second set of data and the second polarity indicator; and
an encoder having first and second encoder inputs and an encoder output, the first encoder input coupled to the XOR output, and the encoder configured to:
receive the first set of data in the inverted form at the first encoder input;
receive the first polarity indicator at the second encoder input;
provide first output data at the encoder output, in which the first output data include: the first set of data in the inverted form; the first polarity indicator; and a first set of error correction coding (ECC) data for the first set of data in the inverted form;
receive the second set of data in the non-inverted form at the first encoder input;
receive the second polarity indicator at the second encoder input; and
provide second output data at the encoder output, in which the second output data include: the second set of data in the non-inverted form; the second polarity indicator; and a second set of ECC data for the second set of data in the non-inverted form.

10. The memory controller of claim 9, wherein when the first polarity indicator indicates that the first output data include the first set of data in the inverted form, the first output data include the first set of ECC data in an inverted form.

11. The memory controller of claim 9, wherein:
the data processor has a control output, and the data processor configured to provide a write-back signal at the control output; and
the memory controller further comprises a multiplexer having first and second multiplexer inputs, a control input, and a multiplexer output, the first multiplexer input coupled to the processor output, the control input coupled to the control output, the multiplexer output coupled to the first XOR input, and the multiplexer configured to:
 receive the first set of data at the first multiplexer input;
 receive a third set of data at the second multiplexer input;
 receive the write-back signal at the control input; and
 provide one of the first or third sets of data at the multiplexer output responsive to the write-back signal.

12. The memory controller of claim 11, further comprising a decoder having a decoder input, and the decoder configured to:
 receive input data at the decoder input, in which the input data include: the third set of data; a third polarity indicator corresponding to the third set of data; and a third set of ECC data for the third set of data and the third polarity indicator; and
 responsive to the third polarity indicator indicating that the third set of data is in an inverted form, check for an error in the third set of data in the inverted form using the third set of ECC data in an inverted form.

13. The memory controller of claim 12, wherein:
the decoder has first and second decoder outputs, and the decoder configured to:
 provide the third set of data at the first decoder output; and
 provide the third polarity indicator at the second decoder output;
the data processor has a processor input;
the XOR circuit is a first XOR circuit; and
the memory controller further includes a second XOR circuit having third and fourth XOR inputs and a second XOR output, the third XOR input coupled to the first decoder output, the fourth XOR input coupled to the second decoder output, the second XOR output coupled to processor input, and the second XOR circuit configured to provide the third set of data in a non-inverted form at the second XOR output.

14. A circuit comprising:
a decoder configured to:
 receive first memory data from a memory array, in which the first memory data include: a first set of data; a first polarity indicator; and a first set of error correction coding (ECC) data for the first set of data and the first polarity indicator, and the first polarity indicator indicates whether both of the first set of data and the first set of ECC data are in an inverted form or in a non-inverted form;
 responsive to the first polarity indicator indicating that both of the first set of data and the first set of ECC data are in the inverted form, determine whether a first error is present in the first set of data using the first set of ECC data in the inverted form;
 receive second memory data from the memory array, in which the second memory data include: a second set of data; a second polarity indicator; and a second set of ECC data for the second set of data and the second polarity indicator, and the second polarity indicator indicates whether both of the second set of data and the second set of ECC data are in an inverted form or in a non-inverted form; and
 responsive to the second polarity indicator indicating that both of the second set of data and the second set of ECC data are in the non-inverted form, determine whether a second error is present in the second set of data using the second set of ECC data in the non-inverted form; and
an encoder configured to:
 receive a third set of data and a third polarity indicator;
 generate a third set of ECC data for the third set of data and the third polarity indicator such that the third polarity indicator indicates whether both of the third set of data and the third set of ECC data are in an inverted form or in a non-inverted form; and
 provide output data to the memory array, in which the output data include: the third set of data; the third polarity indicator; and the third set of ECC data.

15. The circuit of claim 14, wherein:
the decoder is configured to determine whether the first error is present in the first set of data using: the first set of ECC data in the inverted form; and an ECC code;
the encoder is configured to generate the third set of ECC data using the ECC code; and
the ECC code is a polarity-based error correction code.

16. The circuit of claim 14, wherein the decoder is further configured to determine whether the first error is present in the first polarity indicator using the first set of ECC data in the inverted form.

17. The circuit of claim 14 further comprising an XOR circuit coupled to the decoder, and the XOR circuit configured to:
 receive the first set of data and the first polarity indicator; and
 provide a fourth set of data based on performing an XOR operation between the first set of data and the first polarity indicator.

18. The circuit of claim 17 further comprising:
a multiplexer coupled to the XOR circuit and configured to provide the fourth set of data in response to a write-back signal; and
an inverter coupled to the decoder and configured to provide a fourth polarity indicator that is an inverse of the first polarity indicator.

19. The circuit of claim 18, wherein the XOR circuit is a first XOR circuit, the XOR operation is a first XOR operation, the circuit further comprises a second XOR circuit coupled to the multiplexer, the inverter, and the encoder, and the second XOR circuit configured to:
 generate a fifth set of data based on performing a second XOR operation between the fourth set of data and the fourth polarity indicator; and
 provide the fifth set of data to the encoder.

* * * * *